US012282363B2

(12) United States Patent
Torres et al.

(10) Patent No.: US 12,282,363 B2
(45) Date of Patent: Apr. 22, 2025

(54) SYNCHRONIZED DUAL AXIS PIVOT HINGE

(71) Applicant: Dell Products L.P., Round Rock, TX (US)

(72) Inventors: Christopher A. Torres, San Marcos, TX (US); Kevin M. Turchin, Cedar Park, TX (US); Enoch Chen, Wenshan District (TW); An Szu Hsu, New Taipei (TW); Hsu Hong Yao, New Taipei (TW); Yuan Ming Lin, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 622 days.

(21) Appl. No.: 17/579,395

(22) Filed: Jan. 19, 2022

(65) Prior Publication Data
US 2022/0147114 A1    May 12, 2022

Related U.S. Application Data

(62) Division of application No. 16/530,377, filed on Aug. 2, 2019, now Pat. No. 11,294,431.

(51) Int. Cl.
*E05D 3/06*    (2006.01)
*G06F 1/16*    (2006.01)
(Continued)

(52) U.S. Cl.
CPC ............ *G06F 1/1681* (2013.01); *E05D 3/06* (2013.01); *G06F 1/1616* (2013.01); *G09F 9/301* (2013.01);
(Continued)

(58) Field of Classification Search
CPC .... E05D 1/04; E05D 3/06; E05D 3/12; E05D 7/00; G06F 1/1681; G06F 1/1616;
(Continued)

(56) References Cited

U.S. PATENT DOCUMENTS 6,811,491 B1   11/2004  Levenberg et al.
7,281,338 B2   10/2007  Ziegmann et al.
(Continued)

FOREIGN PATENT DOCUMENTS

CN    108079576 A    5/2018
CN    110007784 A    7/2019
(Continued)

OTHER PUBLICATIONS

Nintendo, "Switch," downloaded from https://www.nintendo.com/switch/system/, Feb. 26, 2020, 5 pages.

*Primary Examiner* — Matthew P Travers
(74) *Attorney, Agent, or Firm* — Zagorin Cave LLP; Robert W. Holland

(57) ABSTRACT

A portable information handling system supports a flexible OLED display film over housing portions rotationally coupled by a hinge by folding the OLED display film over the hinge. Hinge brackets that couple to the housing portions each have a helical member that extends into an associated helical guide of the hinge main body. Hinge bracket rotation translates through the helical guides for synchronized housing rotation. The hinge main body has first and second circular portions extending along its length to define first and second rotation axes about which the hinge brackets pivot so that the display film has space to fold in the closed position.

6 Claims, 19 Drawing Sheets

(51) Int. Cl.
  *G09F 9/30* (2006.01)
  *H04M 1/02* (2006.01)
  *H10K 102/00* (2023.01)

(52) U.S. Cl.
  CPC .......... *E05Y 2999/00* (2024.05); *H04M 1/022* (2013.01); *H04M 1/0268* (2013.01); *H10K 2102/311* (2023.02)

(58) Field of Classification Search
  CPC ................ G06F 1/1641; G06F 1/1652; E05Y 2201/604; E05Y 2999/00; H04M 1/022; H04M 1/0268; H10K 2102/311
  See application file for complete search history.

(56) References Cited

U.S. PATENT DOCUMENTS

| | | | |
|---|---|---|---|
| 8,228,667 B2 | 7/2012 | Ma | |
| 8,249,452 B2 | 8/2012 | Biegert et al. | |
| 8,419,541 B2 | 4/2013 | Mao | |
| 8,966,715 B1* | 3/2015 | Chen | G06F 1/1681 16/303 |
| 9,274,566 B1* | 3/2016 | Horng | G06F 1/1681 |
| 9,539,507 B2 | 1/2017 | Schoenith et al. | |
| 9,818,961 B2 | 11/2017 | Hiroki et al. | |
| 9,857,833 B2 | 1/2018 | Morrison | |
| 9,918,395 B1 | 3/2018 | Harmon et al. | |
| 10,082,839 B1 | 9/2018 | Turchin et al. | |
| 10,101,772 B2 | 10/2018 | Aurongzeb et al. | |
| 10,120,421 B1 | 11/2018 | Hong et al. | |
| 10,231,347 B2 | 3/2019 | Seo | |
| 10,303,218 B2 | 5/2019 | Jones et al. | |
| 10,317,934 B2 | 6/2019 | Hampton et al. | |
| 10,344,510 B2 | 7/2019 | Siddiqui | |
| 10,345,858 B2 | 7/2019 | Han et al. | |
| 10,352,354 B1 | 7/2019 | Hsu et al. | |
| 10,480,227 B1 | 11/2019 | Chen et al. | |
| 10,802,549 B2 | 10/2020 | Quinn et al. | |
| 10,817,082 B1 | 10/2020 | Yildiz et al. | |
| 2004/0235566 A1 | 11/2004 | Hussaini et al. | |
| 2007/0097014 A1 | 5/2007 | Solomon et al. | |
| 2010/0282932 A1 | 11/2010 | Ong et al. | |
| 2011/0063783 A1 | 3/2011 | Shim et al. | |
| 2013/0257793 A1 | 10/2013 | Zeliff et al. | |
| 2014/0251044 A1* | 9/2014 | Hsu | G06F 1/1681 74/96 |
| 2014/0251045 A1* | 9/2014 | Hsu | E05D 3/18 74/96 |
| 2014/0267078 A1 | 9/2014 | Kukulski et al. | |
| 2014/0375660 A1 | 12/2014 | Tamaki | |
| 2015/0062525 A1 | 3/2015 | Hirakata | |
| 2015/0177789 A1 | 6/2015 | Jinbo | |
| 2015/0229844 A1 | 8/2015 | Yamazaki et al. | |
| 2015/0245510 A1* | 8/2015 | Hsu | E05D 3/12 16/250 |
| 2015/0260230 A1* | 9/2015 | Xu | E05D 3/06 403/387 |
| 2016/0014914 A1 | 1/2016 | Stroetmann | |
| 2016/0097227 A1 | 4/2016 | Hsu | |
| 2016/0123054 A1* | 5/2016 | Senatori | E05D 3/18 16/359 |
| 2016/0293102 A1 | 10/2016 | Chaji | |
| 2017/0006725 A1 | 1/2017 | Ahn et al. | |
| 2017/0061836 A1 | 3/2017 | Kim et al. | |
| 2017/0108928 A1 | 4/2017 | Clements et al. | |
| 2017/0235337 A1* | 8/2017 | Vic | E05D 3/12 361/679.55 |
| 2017/0272559 A1 | 9/2017 | Cavallaro | |
| 2018/0059866 A1 | 3/2018 | Drake et al. | |
| 2018/0074636 A1 | 3/2018 | Lee et al. | |
| 2018/0088738 A1 | 3/2018 | Barsness et al. | |
| 2018/0173407 A1 | 6/2018 | Kim et al. | |
| 2018/0239402 A1* | 8/2018 | Wang | G06F 1/1679 |
| 2018/0294427 A1 | 10/2018 | Lee | |
| 2018/0309861 A1* | 10/2018 | Lin | H04M 1/021 |
| 2018/0324964 A1 | 11/2018 | Yoo et al. | |
| 2018/0329462 A1* | 11/2018 | Larsen | G06F 1/1681 |
| 2019/0018458 A1 | 1/2019 | Turchin et al. | |
| 2019/0045094 A1 | 2/2019 | Fletcher et al. | |
| 2019/0114070 A1 | 4/2019 | Youn | |
| 2019/0131553 A1 | 5/2019 | Park et al. | |
| 2019/0163320 A1 | 5/2019 | Park et al. | |
| 2019/0163343 A1 | 5/2019 | Ligameri et al. | |
| 2019/0166703 A1 | 5/2019 | Kim et al. | |
| 2019/0243424 A1 | 8/2019 | Lee et al. | |
| 2019/0245955 A1 | 8/2019 | Lee | |
| 2019/0250676 A1* | 8/2019 | Lin | E05D 11/082 |
| 2019/0259351 A1 | 8/2019 | Yoon et al. | |
| 2019/0274227 A1 | 9/2019 | Hsu et al. | |
| 2019/0286200 A1 | 9/2019 | Ho et al. | |
| 2019/0350081 A1 | 11/2019 | Park et al. | |
| 2019/0350096 A1 | 11/2019 | Chao et al. | |
| 2020/0117245 A1 | 4/2020 | Ou et al. | |
| 2020/0166971 A1 | 5/2020 | Lee et al. | |
| 2020/0173208 A1* | 6/2020 | Hsu | G06F 1/1641 |
| 2020/0196461 A1 | 6/2020 | Shin | |
| 2020/0225699 A1 | 7/2020 | Yu et al. | |
| 2020/0225710 A1 | 7/2020 | Pelissier et al. | |
| 2020/0225711 A1 | 7/2020 | Pelissier et al. | |
| 2020/0233466 A1 | 7/2020 | Sanchez et al. | |
| 2020/0291702 A1 | 9/2020 | Hsu et al. | |
| 2020/0319672 A1 | 10/2020 | Kim et al. | |
| 2020/0329574 A1 | 10/2020 | Lee | |
| 2020/0333835 A1 | 10/2020 | Wi et al. | |
| 2020/0371561 A1 | 11/2020 | Lin et al. | |
| 2020/0383215 A1 | 12/2020 | Kim et al. | |
| 2020/0392983 A1 | 12/2020 | Chang et al. | |
| 2020/0401193 A1 | 12/2020 | Hsu et al. | |
| 2020/0409427 A1 | 12/2020 | Hsu | |
| 2020/0409428 A1 | 12/2020 | Wang et al. | |
| 2020/0409429 A1 | 12/2020 | Hsu | |
| 2020/0409431 A1* | 12/2020 | Fan | G06F 1/1652 |
| 2020/0413557 A1 | 12/2020 | Zhang | |
| 2021/0011513 A1 | 1/2021 | Watamura et al. | |
| 2021/0018963 A1 | 1/2021 | Pelissier et al. | |
| 2021/0026406 A1 | 1/2021 | Kim et al. | |
| 2021/0034116 A1 | 2/2021 | Torres et al. | |
| 2021/0034117 A1 | 2/2021 | Torres et al. | |
| 2021/0149456 A1 | 5/2021 | Pelissier et al. | |
| 2021/0191478 A1 | 6/2021 | Mehandjiysky et al. | |
| 2021/0207414 A1 | 7/2021 | Wang | |
| 2021/0208641 A1* | 7/2021 | Huang | H04M 1/022 |

FOREIGN PATENT DOCUMENTS

| | | |
|---|---|---|
| JP | 2017220185 A | 12/2017 |
| KR | 20150056066 A | 5/2015 |

\* cited by examiner

SYNCHRONIZED DUAL AXIS PIVOT HINGE

CROSS-REFERENCE TO RELATED APPLICATION(S)

This application is a divisional of U.S. patent application Ser. No. 16/530,377, filed Aug. 2, 2019, entitled "Synchronized Dual Axis Pivot Hinge," naming Christopher A. Torres, Kevin M. Turchin, Enoch Chen, An Szu Hsu, Hsu Hong Yao, and Yuan Ming Lin as inventors and is incorporated by reference in its entirety.

This application is related to U.S. patent application Ser. No. 16/530,367, entitled "Gear Synchronized Dual Axis Pivot Hinge" by inventors Christopher A. Torres, Kevin M. Turchin, Enoch Chen, Anthony J. Sanchez, Kai-Cheng Chao, Chia-Hao Hsu, and Chia-Huang Chan, and is incorporated by reference in its entirety.

This application is related to U.S. patent application Ser. No. 17/505,363, filed Oct. 19, 2021, entitled "Gear Synchronized Dual Axis Pivot Hinge" by inventors Christopher A. Torres, Kevin M. Turchin, Enoch Chen, Anthony J. Sanchez, Kai-Cheng Chao, Chia-Hao Hsu, and Chia-Huang Chan, describes exemplary methods and systems and is incorporated by reference in its entirety.

BACKGROUND OF THE INVENTION

Field of the Invention

The present invention relates in general to the field of portable information handling system hinges, and more particularly to an information handling system synchronized dual axis pivot hinge.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Convertible information handling system configurations typically include multiple separate housing portions that couple to each other so that the system converts between closed and open positions. The closed position provides a smaller footprint for storing, protecting and carrying the information handling system. In some conventional systems, the open position holds a display in a viewing position and expose a keyboard for accepting keyed inputs. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display.

Recently, the availability of organic light emitting diode (OLED) displays has generated interest is convertible information handling systems that fold an OLED display to achieve a closed position. OLED displays integrate OLED material in a film that is flexible so that an OLED display disposed over both the main and lid housing portions can fold at the hinge that rotationally couples the housing portions together. In an unfolded configuration with the housing portions in a parallel plane, the OLED display provides a tablet configuration with a larger surface area for viewing information. In a partially folded configuration with the housing portions in a perpendicular orientation, one portion of the OLED display is positioned vertically to present visual images while the other portion is positioned horizontally to accept typed inputs at a virtual keyboard presented by the display. Avoiding the use of an integrated keyboard tends to reduce the thickness and weight of the system for improved mobility.

One difficulty that arises with integration of a foldable OLED display in a convertible information handling system is that OLED films are susceptible to breakage if folded at too sharp of an angle. A variety of display support arrangements exist that attempt to alleviate such breakages by avoiding tensile and compressive stresses on the OLED film during folding and unfolding. One technique is to use a conventional dual axis gear-synchronized hinge that forms a space between the axes in which the OLED film may fold at a natural angle. A difficulty with this approach is that a large space between the axes increases the thickness of the information handling system. Another difficulty with this approach is that the circumference of the display on the inside of a folded housing shrinks relative to the circumference of the outside of the housing. To correct for this effect, the hinge area has to provide room for the OLED film to expand or the OLED film has to slide relative to the housing at each housing end opposite the hinge. In addition, some support typically has to be added under the OLED film so that presses on the OLED film over the hinge, such as finger or stylus touch inputs, will not create stress at the OLED film.

One alternative to using a dual axle geared hinge is a single axis pivot hinge. The single axis pivot hinge has a central body that acts as a support under the OLED film in the open position and two arms that rotate about a central axis of the central body between closed and open positions. In the closed position, the two arms leave space between each other to allow the OLED film to fold. To support motion of the two arms about the single axis, the base of the arms follow an arc path at the backside of the central body. Although a single axis pivot hinge provides a support surface to hold the OLED film in the open configuration, the support surface remains fixed in position relative to the OLED film, which limits the room available for the OLED film to expand as the housing inner circumference is reduced in the closed position.

SUMMARY OF THE INVENTION

Therefore, a need has arisen for a system and method which provides a synchronized dual axis pivot hinge to rotationally couple information handling system housing portions having flexible display film.

In accordance with the present invention, a system and method are provided which substantially reduce the disadvantages and problems associated with previous methods and systems for supporting a flexible display over a hinge that rotationally-couples portable housing portions together. A hinge assembly rotates opposing brackets about dual axes to define a pivot motion that translates opposing housing portions up and away from the hinge assembly to maintain a fold radius of a flexible display film disposed over the hinge assembly. A fold region defined below the dual axes provides additional room for a flexible display film to fold below the plane on which the display film rests in an open position.

More specifically, an information handling system processes information with processing components disposed in a housing, such as central processing unit (CPU) that executes instructions and a random access memory (RAM) that stores the information and instructions. The housing has first and second portions rotationally coupled to each other by a dual axis pivot hinge assembly that has opposing brackets coupled to opposing housing portions and pivotally rotating about a hinge main body. In one embodiment, the hinge main body has first and second adjacent semicircular portions along a length with each semicircular portion defining a rotation path of an adjacent bracket through a helical member extending from the bracket and engaging a helical guide defined within the semicircular portion. Rotation of a bracket synchronizes with rotation of an opposing bracket by translating rotational movement through a sliding motion of the helical guide. In an alternative embodiment, a gear subassembly synchronizes rotation of opposing brackets through a gear member that extends from each bracket and into the hinge main housing. The gear member has gear teeth formed along an inner circumference and a smooth surface along an outer circumference. As motion of a bracket slides the smooth portion about a semicircular portion formed in the hinge main housing, teeth of the inner circumference engage with the gear subassembly to translate motion to the other bracket. Translation of motion to synchronize brackets relies upon a planetary gear arrangement that effectively increases the distance of the bracket from the main hinge during rotation to adapt a flexible display film disposed over the hinge assembly to the inner circumference formed by the housing portions. The helical member and helical guide interaction provides similar bracket synchronization and pivotal rotation about dual axes without including gears.

The present invention provides a number of important technical advantages. One example of an important technical advantage is that a portable information handling system rotationally couples separate housing portions to rotate with dual pivot arms, each about a separate axis. The hinge reduces system height with a concealed synchronized sliding cam mechanism and integrated variable torque elements. In an open position, hinge support portions raise to the OLED film height to provide support against touch inputs made at the display touchscreen. In the closed position, the hinge support portions rotate to a lower height that provides room for the flexible display film to fold without inducing tensile or compressive stress. The mono-hinge construction provides a robust solution that withstands repeated open and close cycles and that offers stable cable routing between the housing portions, such as for routing flexible cables to communicate information and power.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system hinge pivots about dual axes to define a fold region that provides space for a flexible display film to fold as the hinge rotates to a closed position. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
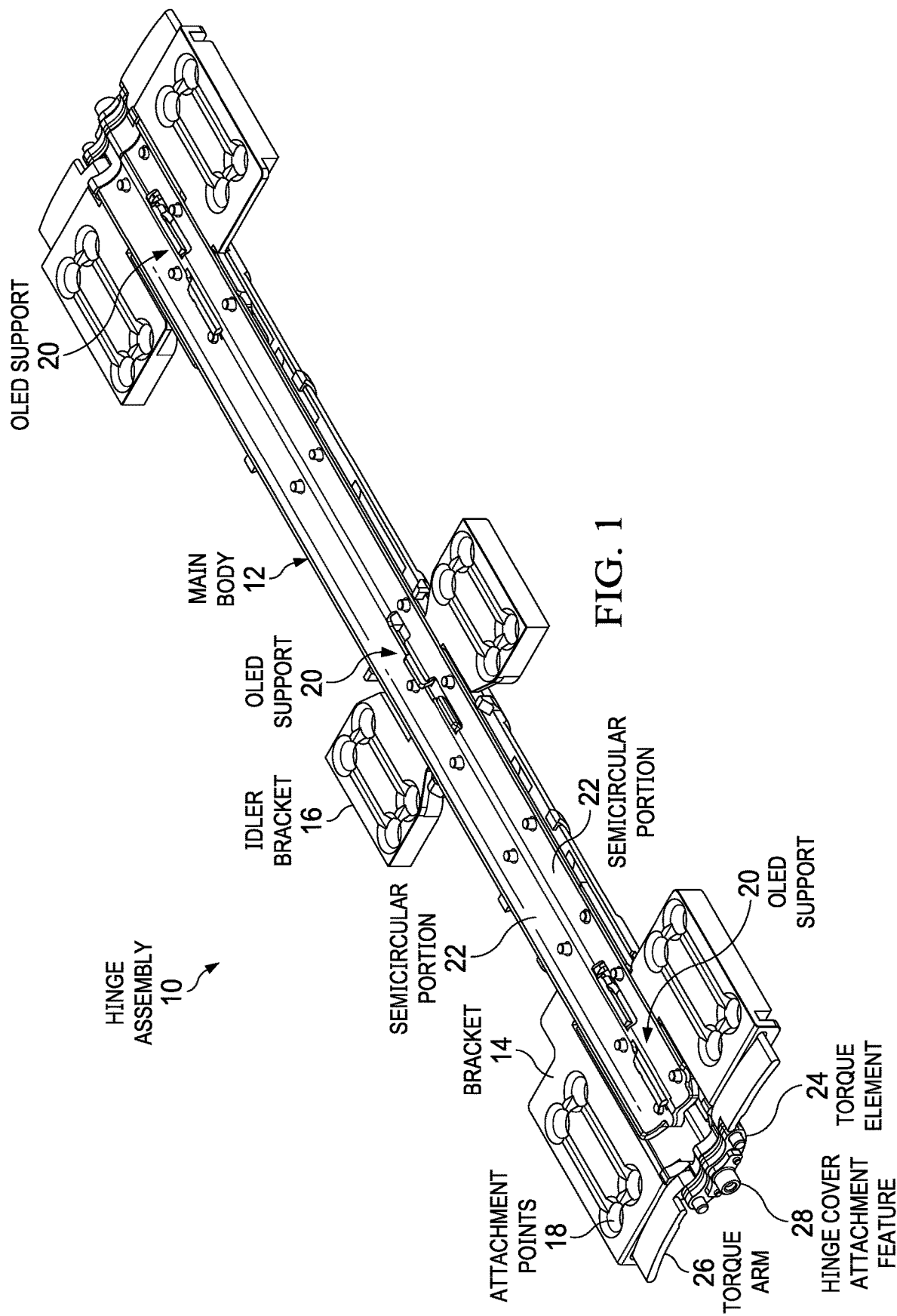
FIG. 1 depicts an upper perspective view of a hinge assembly having a dual axis pivot that defines a flexible display film fold region.

Referring now to FIG. 1, an upper perspective view depicts a hinge assembly 10 having a dual axis pivot that defines a flexible display film fold region. Hinge assembly 10 is constructed of a main body 12 that extends along a length, such as a length sufficient to extend between opposing sides of a portable information handling system having rotationally coupled housing portions. A set of opposed brackets 14 are disposed at opposing sides of main body 12 and an idler bracket 16 is disposed between main brackets 14. Each of brackets 12 and idler brackets 16 include attachment points 18 that accept a coupling to an information handling system housing, such as openings through which bolts or screws insert. In the example embodiment, brackets 14 and idler brackets 16 have rotated to an open position, such as supports a tablet configuration of a portable information handling system that has rotationally coupled housing portions disposed in a common plane. Display film supports 20, such as for an OLED display film, extend upwards from a central position of main body 12 along its length. Specifically, display film supports 20 extend upward between first and second semicircular portions 22 defined parallel to each other along the length of main body 12. Each semicircular portion 22 defines an axis of rotation about which brackets 14 and idler brackets 16 pivot, as set forth in greater detail below.

Brackets 14 each rotate substantially ninety degrees from the depicted open position to a closed position that folds a flexible display film disposed over hinge assembly 10 within a fold region defined between brackets 14. A torque element 24 couples to each opposing end of main body 12 and includes friction devices that generate torque in opposition to rotational movement. A torque arm 26 rotationally couples to torque element 24 and engages with bracket 14 so that rotation of bracket 14 is resisted with torque provided by torque element 24 and translated through torque arm 26. A hinge cover attachment feature 28 couples at a central location of torque element 24 to accept a protective and/or decorative cover of an information handling system assembly. As described below in greater detail, opposing brackets 14 have a synchronized motion driven through interactions with semicircular portions 22 so that movement of one bracket 14 is translated to the opposing bracket 14 with a torque provided by torque element 24.

Figure 2:
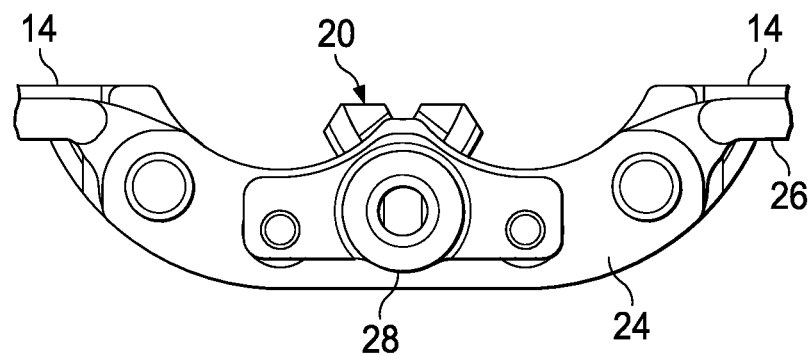
FIG. 2 depicts a side view of the hinge assembly in an open position having display supports extending upward at a central location of the main body.

Referring now to FIG. 2, a side view of hinge assembly 10 depicts an open position having display supports 20 extending upward at a central location of main body 12. The upper surface of brackets 14 define a support plane for a flexible display film with display film supports 20 extending upward to the display film support plane. In the open position of brackets 14, display supports 20 have an upper surface that aligns with the display film support plane. Torque element 24 has opposing first and second rotational attachment points at which first and second torque arms 26 rotationally couple. Torque arms 26 translate torque from torque element 24 to resist rotational movement of brackets 14. Hinge cover attachment feature 28 provides a central attachment location for a protective and/or decorative housing feature.

Figure 3:
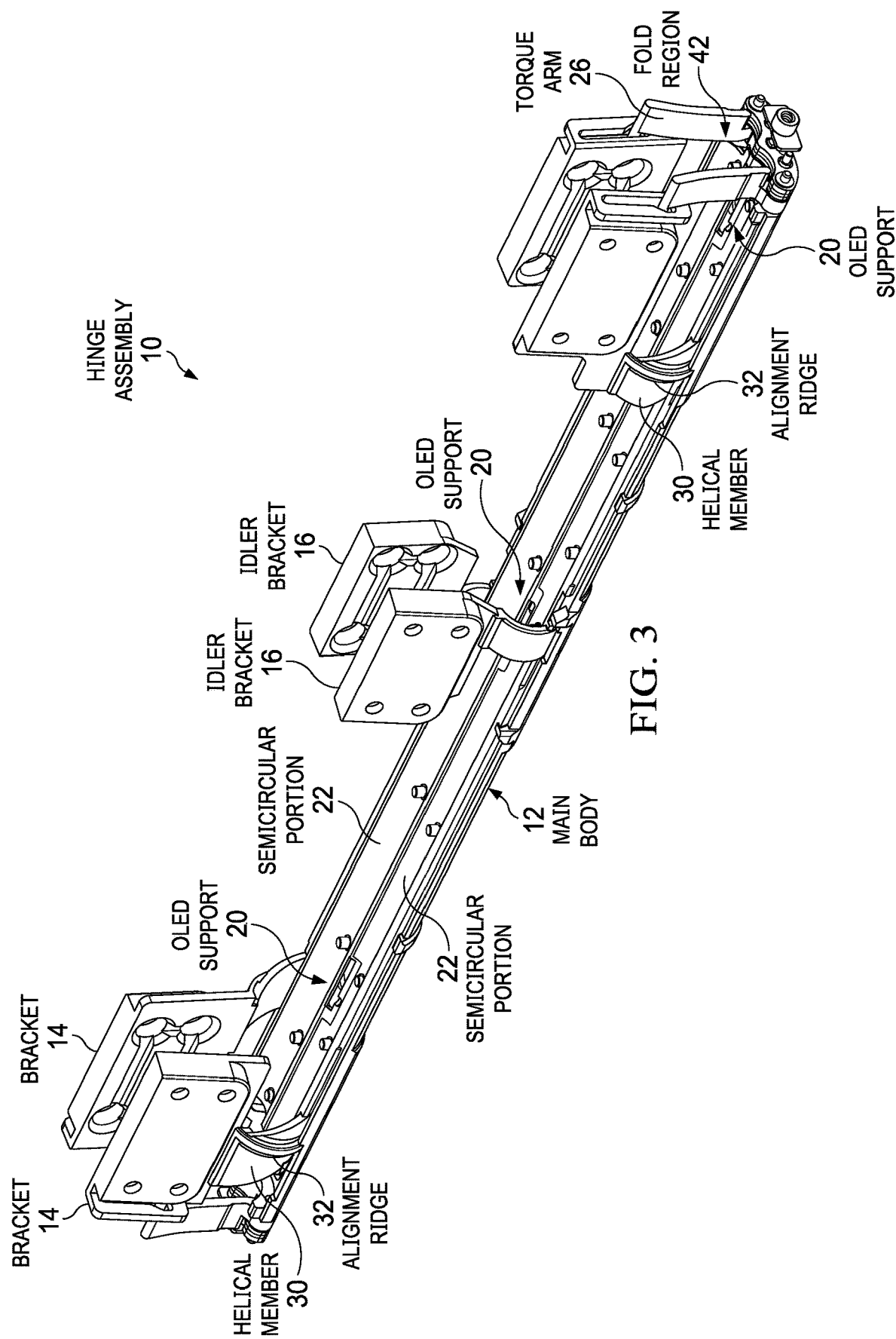
FIG. 3 depicts an upper perspective view of the hinge assembly having a dual axis pivot with opposing brackets rotated to a closed position that defines a fold region.

Referring now to FIG. 3, an upper perspective view depicts a hinge assembly 10 having a dual axis pivot with opposing brackets 14 rotated to a closed position that defines a fold region 42. In the closed position, brackets 14 extend upward and away from main body 12 with motion defined by engagement of a helical member 30 extending from each bracket 14 with a sliding rotational pivot defined by a semicircular portion 22. The upward movement by bracket 14 away from main body 12 with rotation to the closed position from the open position adapts housing portion relative positions so that an inner circumference of the information handling system housing matches the length of a folded display film. Helical member 30 engages with a helical guide formed in main body 12 while an alignment ridge 32 extending from helical member 30 engages with an alignment guided to maintain the relative position of brackets 14 at main body 12. In the closed position, display film supports 20 retract into main body 12 so that a display film folded in fold region 42 has additional room to adopt its natural folded state without tensile or compressive stress. Idler brackets 16 provide additional stiffness to hinge assembly 10 that further help to minimize flexure and warpage of a display film during changes in housing positions by rotation of hinge assembly 10 between the open and closed positions.

Figure 4:
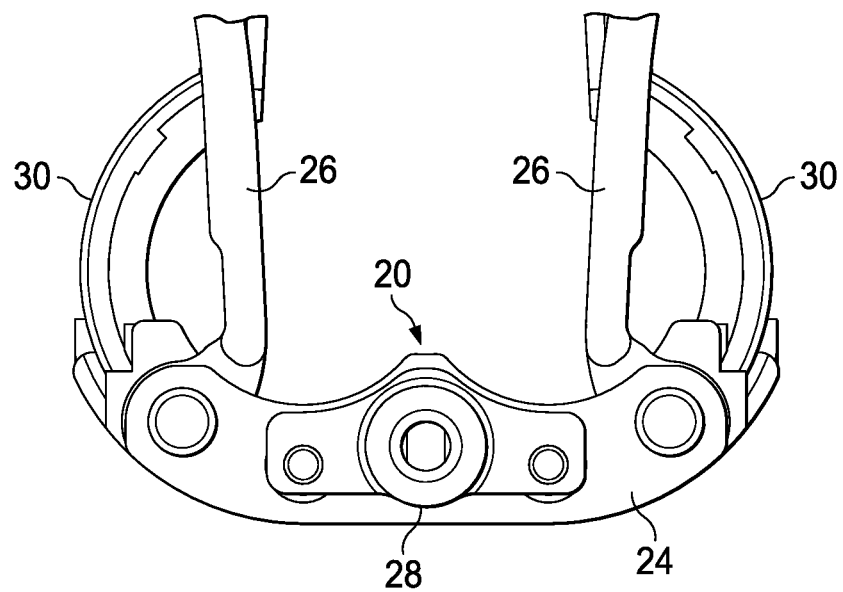
FIG. 4 depicts a side view of the hinge assembly in a closed position having display supports withdrawn into a central location of the main body and the brackets rotated to define the fold region.

Referring now to FIG. 4, a side view depicts hinge assembly 10 in a closed position having display film supports 20 withdrawn into a central location of main body 12 and brackets 14 rotated to define fold region 42. In the example embodiment, the size of fold region 42 is effectively increased by withdrawal of display film supports 20. Helical members 30 rotate out of main body 12 with semicircular shape that matches the shape of semicircular portions 22, resulting in a pivot motion of bracket 12. Each bracket 12 pivots about its own rotation axis, defined by the semicircular portion 22 in which the bracket 12 helical member 30 couples. As a result of the dual axis pivot movement of brackets 12, information handling system housing portions coupled with brackets 12 move in a controlled manner about folding region 42 relative to a stable main body 12 so that cables, thermal components, mechanical structures and other internal system components function through a full 180 degrees of motion between the depicted closed position and the tablet open position of FIG. 1 without damage or interruption. Hinge assembly 10 provides robust mono-hinge construction for coupling of mobile housing portions to meet hinge cycling and bending constraints within a minimal-sized housing.

Figure 5:
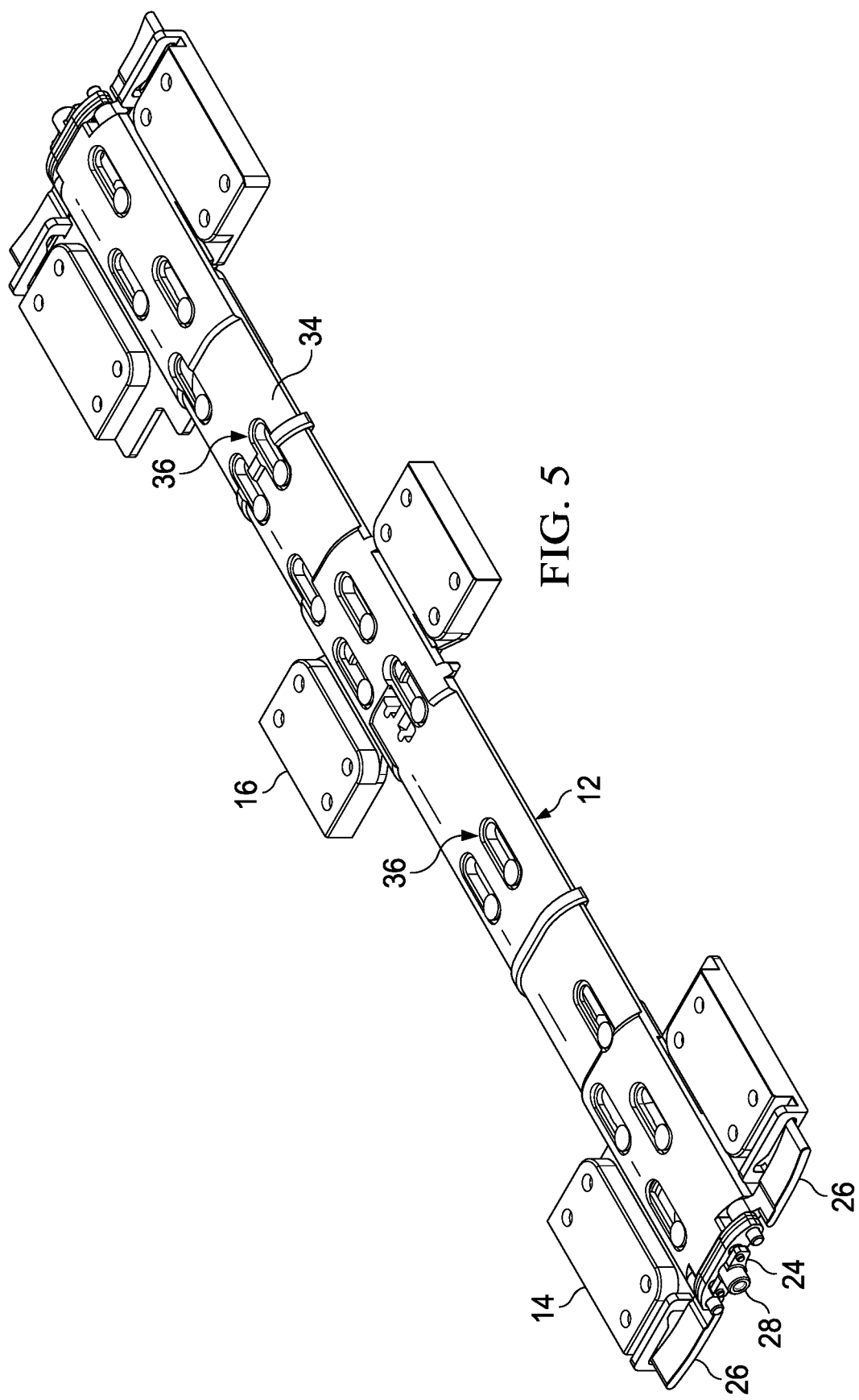
FIG. 5 depicts a lower perspective view of the bottom of the hinge assembly in an open position.

Referring now to FIG. 5, a lower perspective view depicts the bottom of hinge assembly 10 in an open position. A back cover 34 forms the back side of main body 12 and defines channels 36 through which cables can pass across hinge assembly 10. For example, back cover 34 fixes cables in place as the cables pass through hinge assembly 10 to avoid damage and define flex regions for the cables outside of hinge assembly 10 where reinforcement may be applied to ensure cable integrity.

Figure 6A:
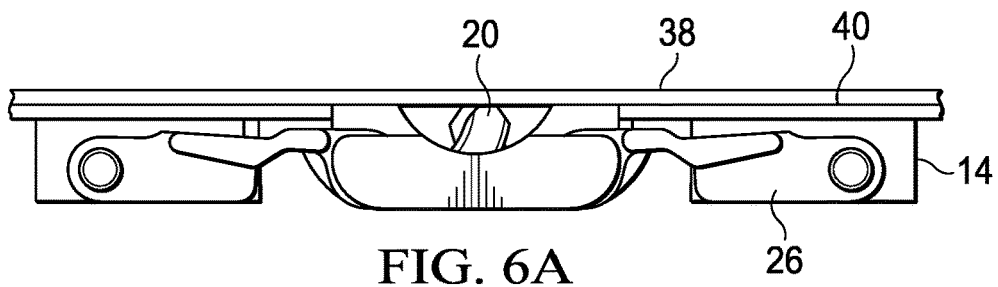
FIGS. 6A through 6G depict a series of side views of folding of a flexible display film across a multi-axis hinge with pivoting of brackets to define a fold region.
Figure 6B:
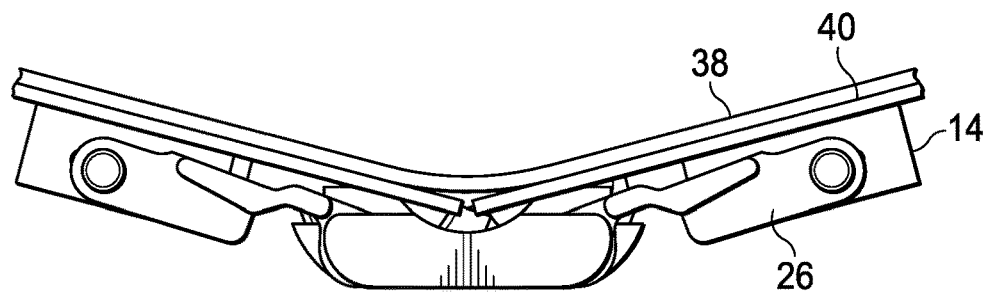
Figure 6C:
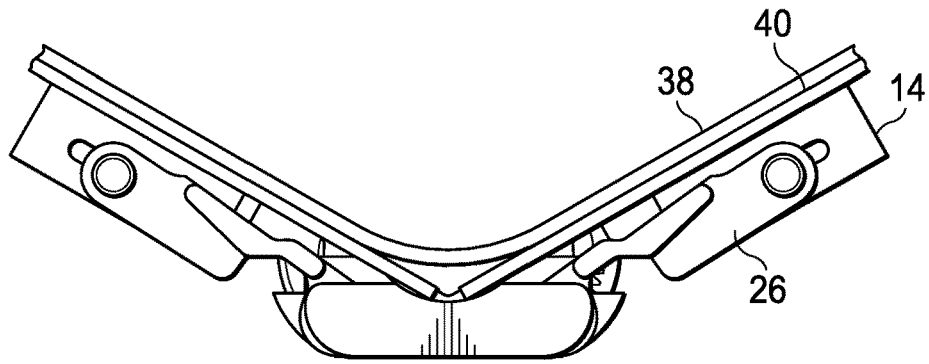
Figure 6D:
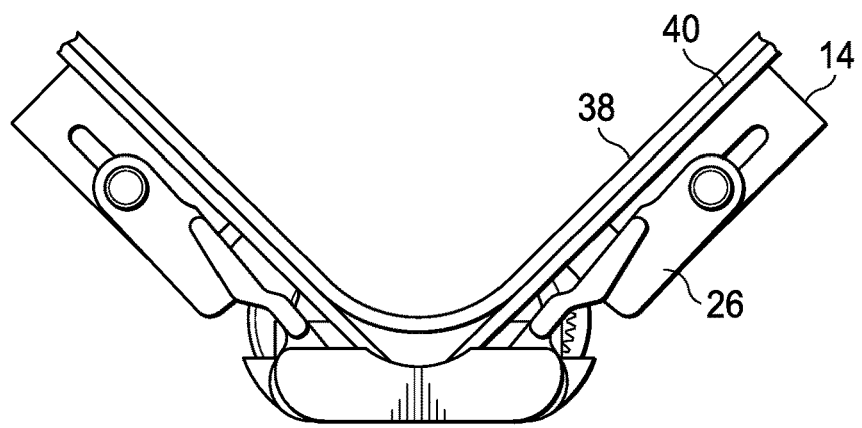
Figure 6E:
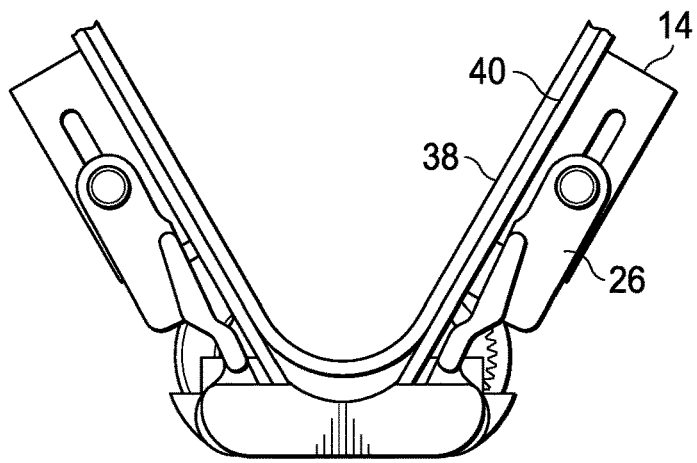
Figure 6F:
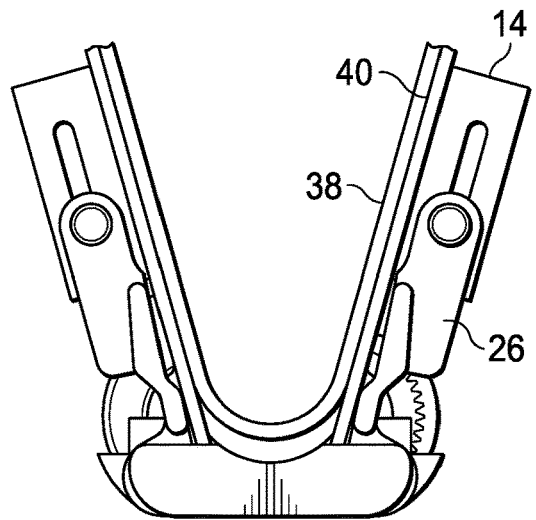
Figure 6G:
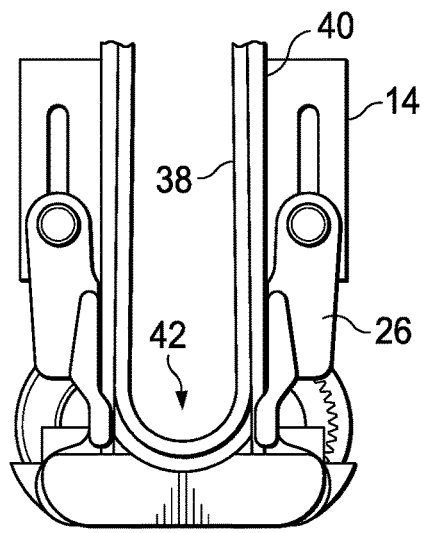

Referring now to FIGS. 6A through 6G, a series of side views depict folding of a flexible display film across a multi-axis hinge with pivoting of brackets to define a fold region. In a fully open position depicted by FIG. 6A, a flexible display film is supported over a flexible support surface to accept touch inputs in a tablet mode of operation. Flexible display supports 20 extend upwards in a middle position of hinge assembly 10 to provide support against flexible display support 40. FIG. 6B depicts rotation of hinge assembly 10 from the 180 degree open position of FIG. 6A to a 150 degree open position in which flexible display supports 20 retract somewhat into hinge assembly 10, providing room for flexible display support 40 to bend and separate from flexible display film 38. As the housing rotation angle continues to increase in FIGS. 6C and 6D, fold region 42 is defined within hinge assembly 10 to provide room for flexible display film 38 to fold in a natural manner without tensile or compressive stress. Continuing to FIGS. 6E, 6F and 6G, as hinge assembly 10 completes closure of opposing housing portions to a substantially parallel relationship, fold region 42 provides room for flexible display film 38 to fold below the plane defined by flexible display film 38 in the open position of FIG. 6A. The additional space is defined by the bracket 14 movement about separate rotational axes, which provides a pivot motion about fold region 42.

Figure 7:
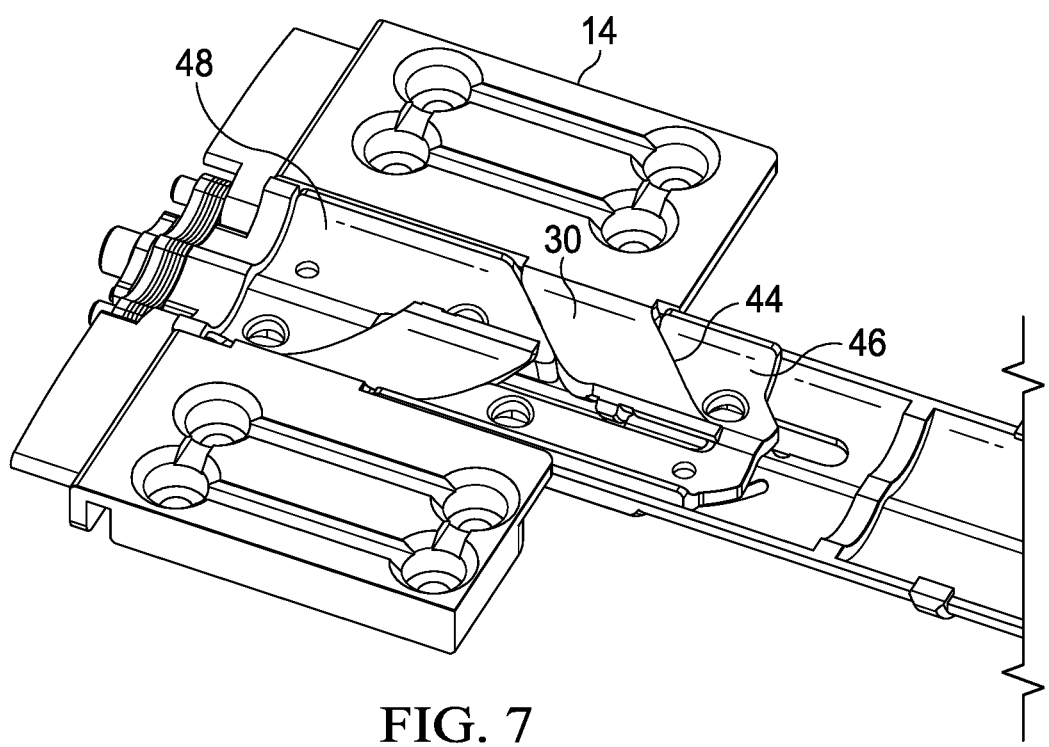
FIG. 7 depicts an upper perspective cutaway view of interactions between helical members of brackets coupled to the hinge assembly and helical guides defined within the main body of the hinge assembly.

Referring now to FIG. 7, an upper perspective cutaway view depicts interactions between helical members 30 of brackets coupled to hinge assembly 10 and helical guides 44 defined within main body 12 of hinge assembly 10. Helical guides 44 are defined between an inner sliding cam 46 and an outer sliding cam 48. As either bracket 14 rotates, its helical member 30 works against the cam surface of sliding cams 46 and 48 to change the position of sliding cams 46 and 48, which slide back and forth along the length of main body 12. Changes in the position of sliding cams 46 and 48 caused by one bracket 14 helical member 30 translates to the opposing bracket 14 helical member 30 through movement of sliding cams 46 and 48, which causes synchronized rotation of the opposing brackets 14. At the ends of each helical member 30, an extension protrudes out of helical guide 44 to act as a flexible display film support 20. In the example embodiment, the relative position of each flexible display support 20 along the length of main body 12 to distribute support along the display film.

Figure 8:
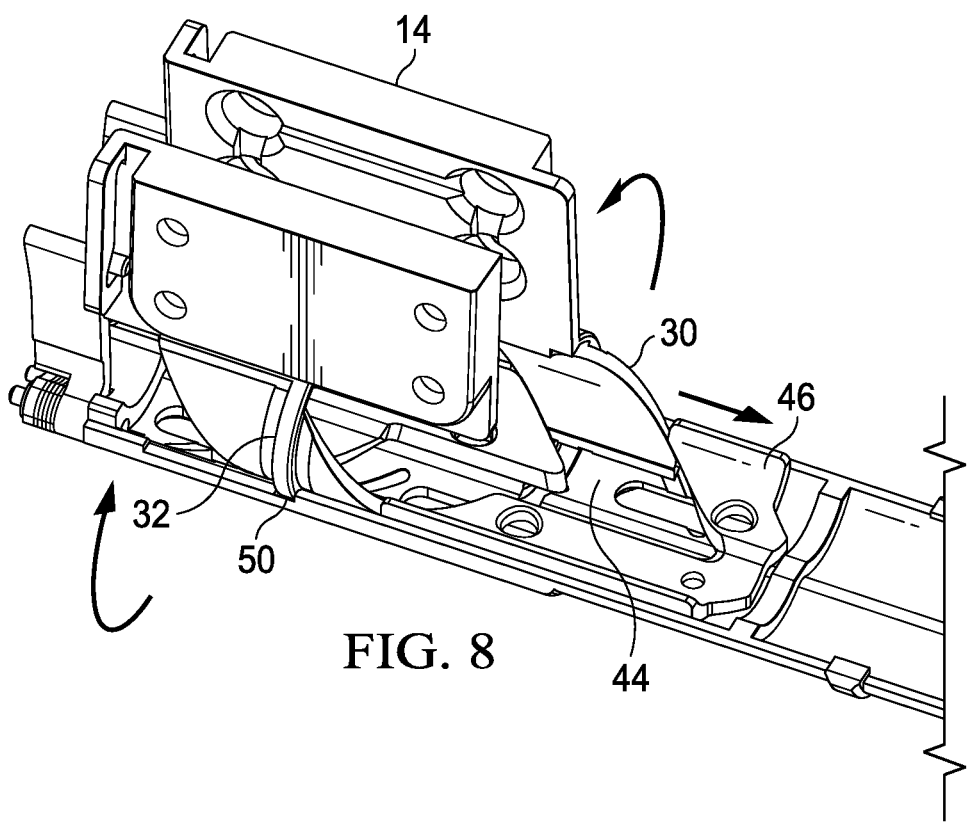
FIG. 8 depicts an upper perspective cutaway view of the brackets rotated in a synchronized manner to a closed position coordinated by action of the sliding cams.

Referring now to FIG. 8, an upper perspective cutaway view depicts brackets 14 rotated in a synchronized manner to a closed position coordinated by action of sliding cams 46 and 48. Alignment ridge 32 has a substantially perpendicular orientation relative to the length of main body 12 and engages in an alignment guide 50 formed in main body 12. The engagement of alignment ridge 32 in alignment guide 50 maintains bracket 14 in a fixed position along the length of main body 12 as helical members 30 rotate within helical guides 44. As a bracket 14 is rotated from the open position of FIG. 7 towards the closed position of FIG. 8, the helical member 30 pushes against sliding cams 46 and 48 forcing sliding cams 46 and 48 to slide towards a central position of main body 12. As cams 46 and 48 slide, engagement with the helical member 30 of the opposing bracket 14 forces rotation of the opposing bracket to maintain a fixed position at main body 12 while sliding cams 46 and 48 move. In the example embodiment, helical guides 44 and helical members 30 act, essentially, as threads of a screw and nut that rotationally engage as brackets 14 rotate. For instance, helical guides 44 and helical members 30 have an angle, also generally referred to as a pitch, of about 45 degrees relative to the axis of rotation. The pitch used for a particular hinge may vary based upon a number of factors, such as the amount of curvature to be defined for folding the display film and the adjustment to the circumference along the fold so that the display film remains stationary as the housing rotates. That is to say, although the example angle of pitch of the helical member and helical guide is approximately 45 degrees, other pitches may be selected based upon system fold angle, thickness, length and width so that the display film folds within acceptable torsional and compressive forces.

Figure 9:
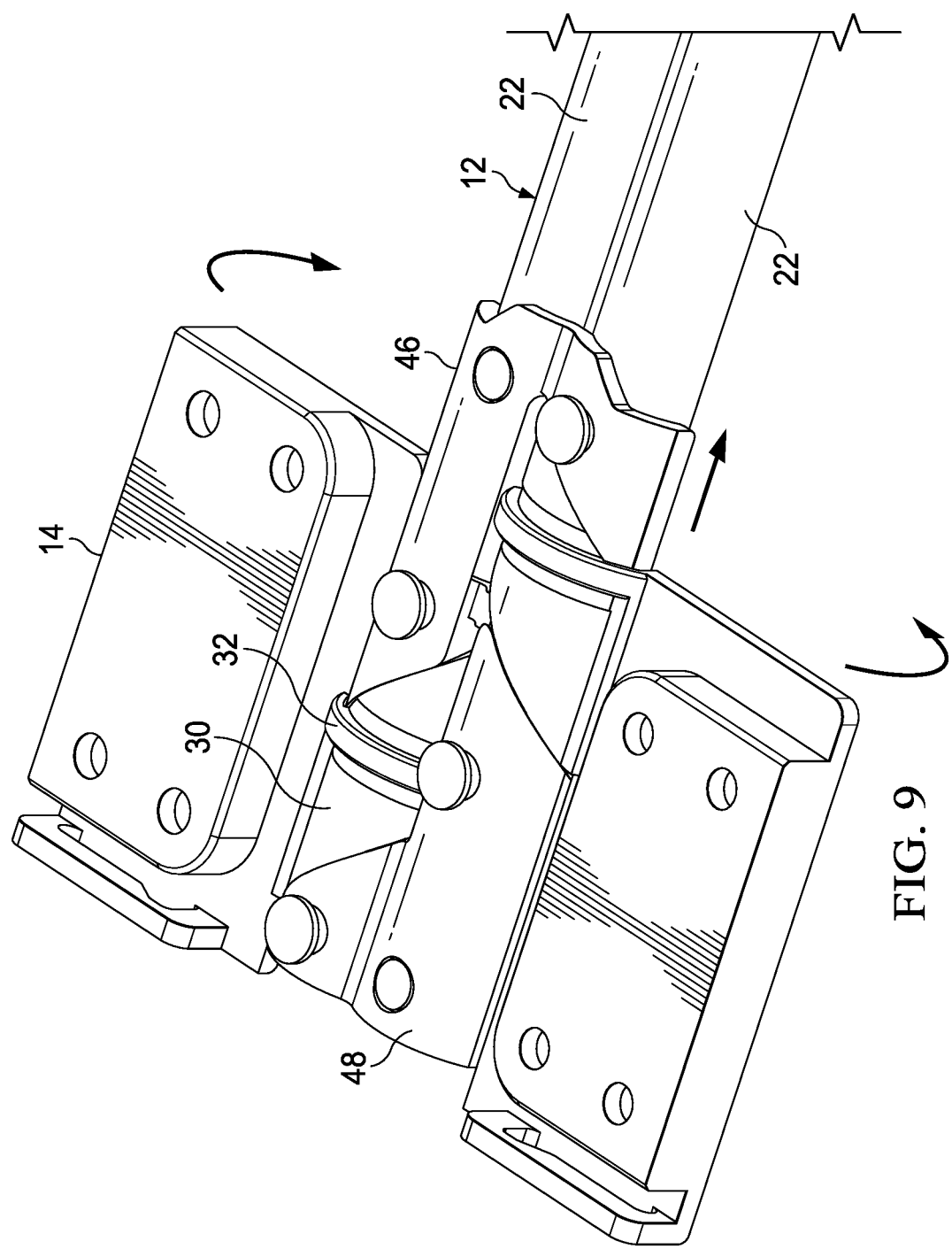
FIG. 9 depicts a lower perspective cutaway view of interactions between the helical members and the helical guides defined by the sliding cams.
Figure 10:
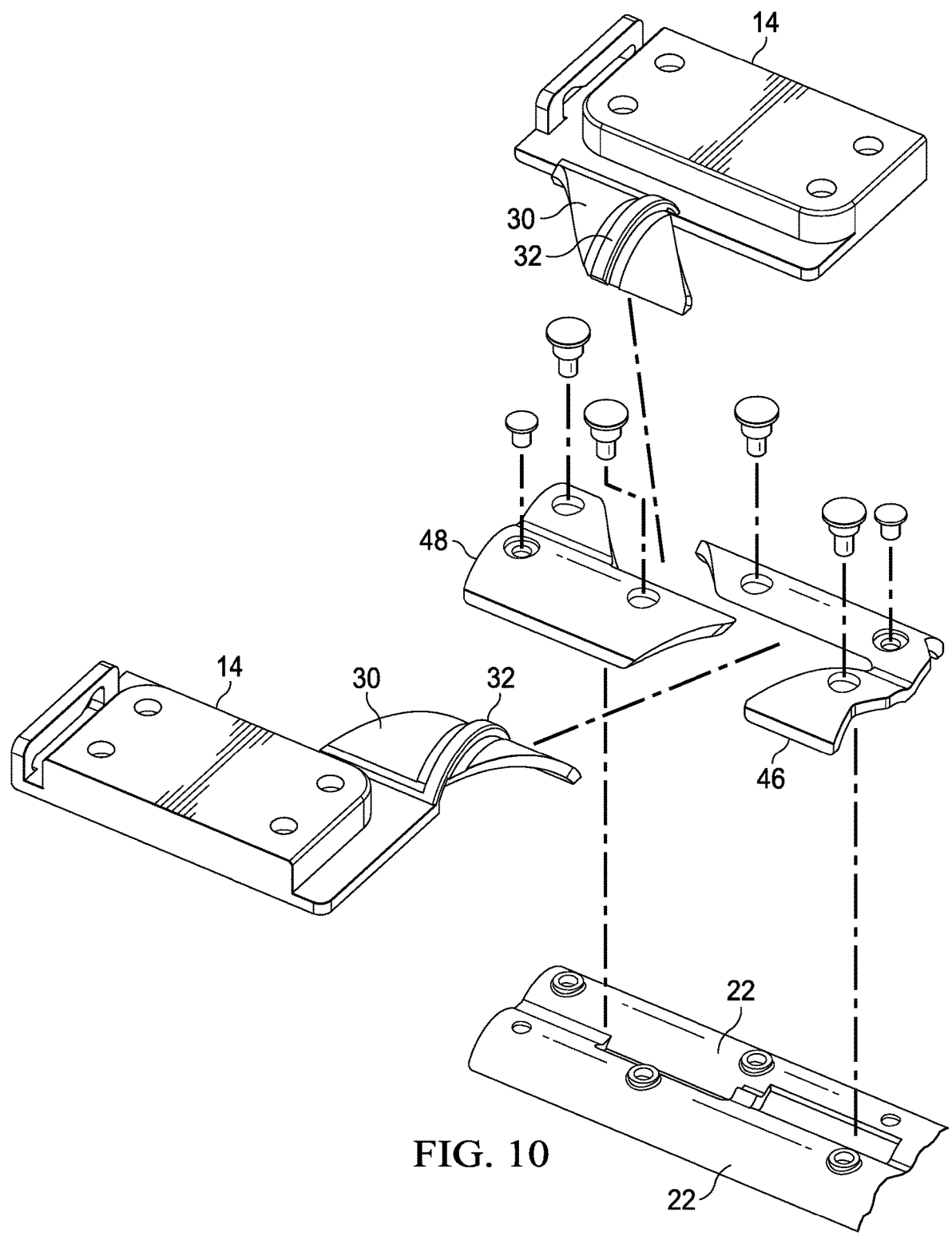
FIG. 10 depicts an exploded view of a hinge assembly that synchronizes bracket movement though helical member engagement with helical guides.

Referring now to FIG. 9, a lower perspective cutaway view depicts interactions between helical members 30 and helical guide 44 defined by sliding cams 46 and 48. FIG. 10 depicts an exploded view of hinge assembly 10 with synchronized bracket movement though helical member 30 engagement with helical guides 44. As described above, sliding cams 46 and 48 work cooperatively with helical members 30 so that rotation of one bracket 14 translates to rotation of the opposing bracket 14 in a synchronized manner. Alignment ridge 32 engages with hinge main body 12 throughout the rotational range of bracket 14 to maintain bracket 14 in its relative position along main body 12. Force applied across the helical geometries of helical members 30 and helical guide 44 translates to synchronized motion of brackets 14 since rotation is the only unconstrained direction in which brackets 14 can move.

Figure 11:
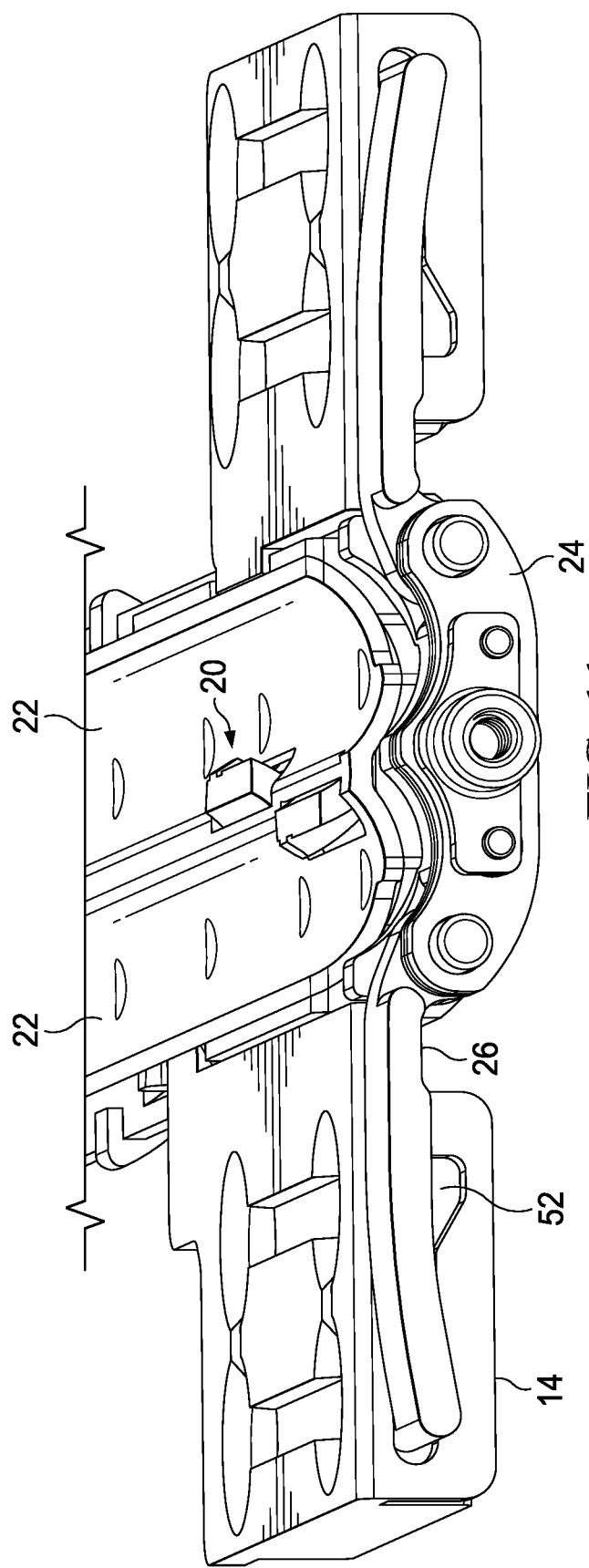
FIG. 11 depicts a side perspective view of an end of the hinge assembly having torque to resist bracket rotation communicated from a torque element through torque arms.

Referring now to FIG. 11, a side perspective view depicts an end of hinge assembly 10 having torque to resist bracket 14 rotation communicated from a torque element 24 through torque arms 26. In the depicted open position, semicircular portions 22 show the rotational path followed by helical members of bracket 14 that are captured within main body 12. Flexible display film supports 20 extend upwards between the semicircular portions 22. Each torque arm 26 rotationally couples to torque element 24, which generates torque to resist rotational movement of torque arm 26. Opposite the rotational coupling to torque element 24, each torque arm 26 engages in a slot 52 of bracket 14 to translate generated torque to work against rotation of bracket 14. In the example embodiment, slot 52 has a nonlinear shape that varies the translation of torque based upon the rotational orientation of brackets 14. In various embodiments, various non-linear configurations may be adapted to increase and/or decrease torque translated from torque element 24 based upon rotational orientation. Alternatively, a linear slot 52 may be used or other types of coupling arrangements that adapt to the different axes of rotation followed by bracket 14 and torque arm 26. For instance, torque arm 26 might co-locate with the rotation axis of semicircular portion 22 so that a rotational coupling is used at bracket 14 instead of slot 52. In such an embodiment, variable torque may be created by torque element 24, such as with selective alignment of friction plates. In an alternative embodiment, torque element 24 may be integrated within bracket 14.

Figure 12A:
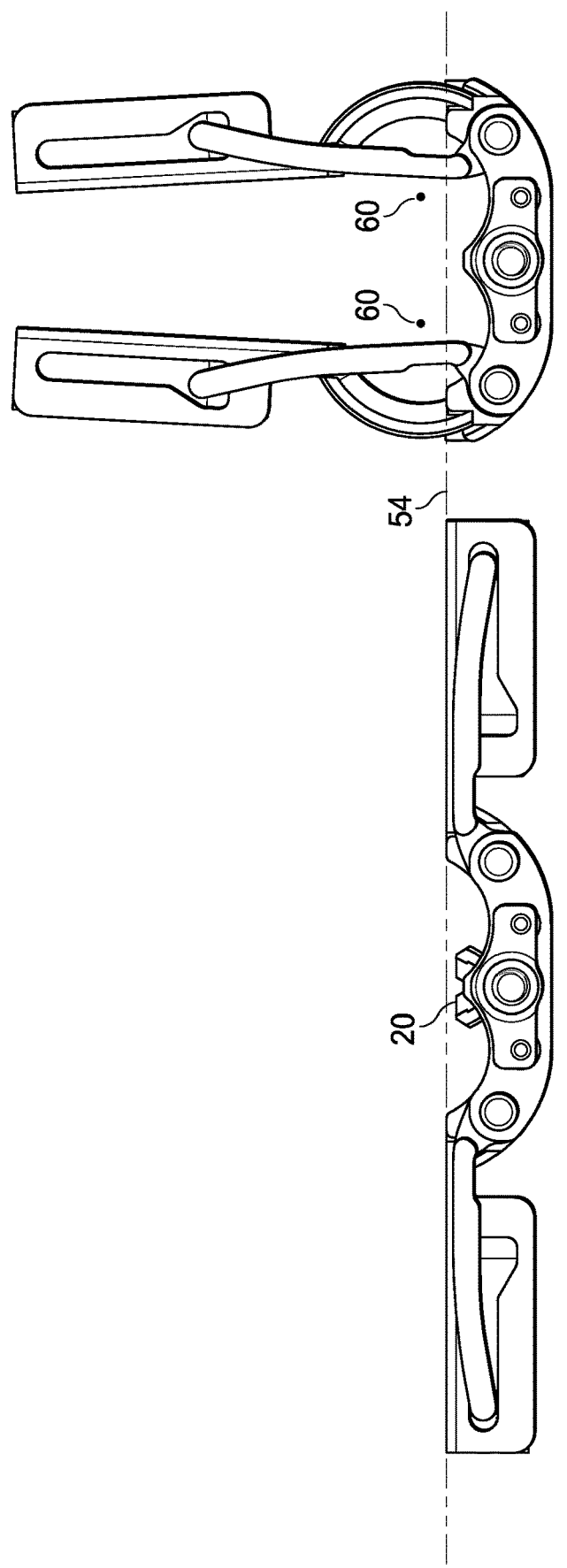
FIGS. 12A and 12B depict a side cutaway view that compares a fold region provided by a single axis pivot hinge and a dual axis pivot hinge.
Figure 12B:
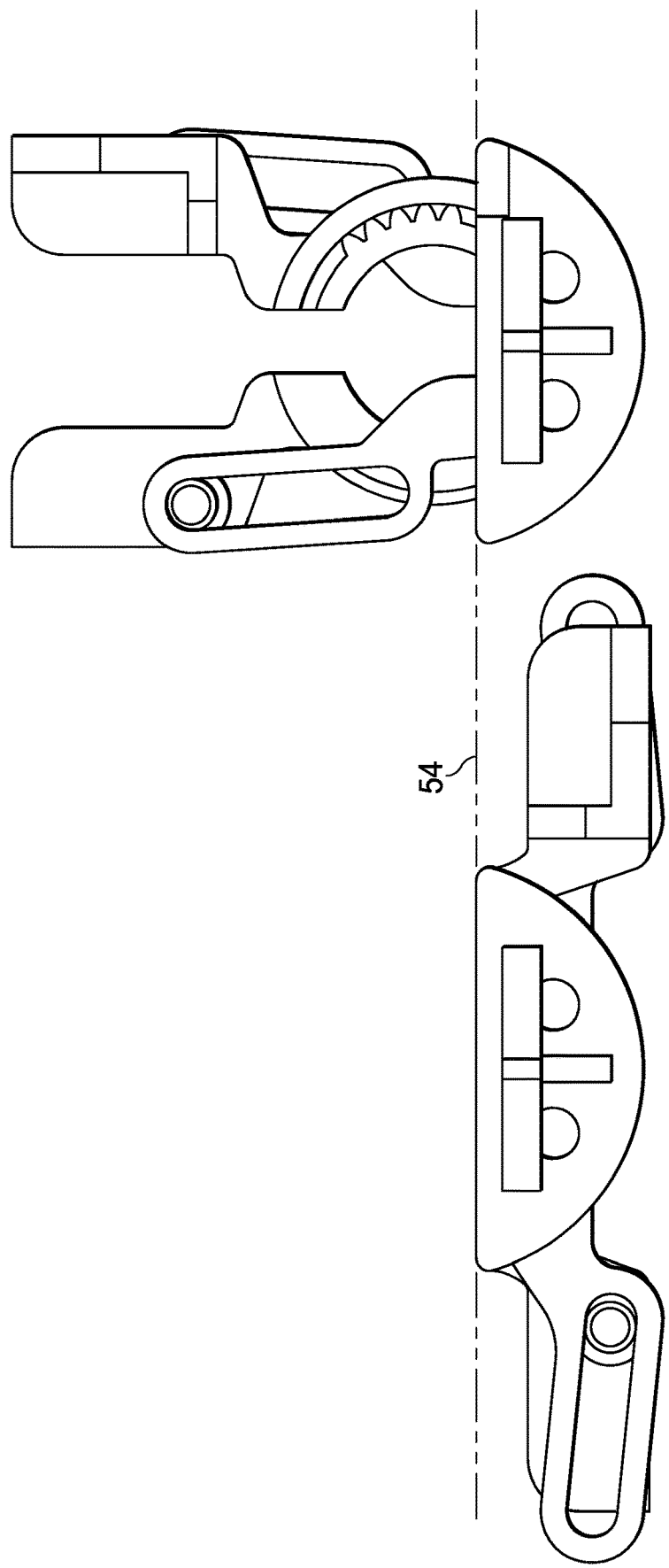

Referring now to FIGS. 12A and 12B, a side cutaway view compares a fold region 42 provided by a single axis pivot hinge and a dual axis pivot hinge. In FIG. 12A, a display plane 54 is defined in an open position by brackets 14 that extend over top of hinge assembly 10. Display film supports 20 extend upwards from hinge assembly 10 to substantially align with display plane 54 and offer support to a display film disposed over brackets 14 and across hinge assembly 10. In the closed position, each bracket 14 rotates about one of dual axis 60 and display film supports 20 retract so that additional space is made available under display plane 54 for fold region 42. In contrast, FIG. 12B depicts a single axis pivot hinge having brackets 14 rotating about a common axis at a central location. Display plane 54 remains at the upper surface of the mono-axis hinge assembly 10 in both the folded and unfolded state.

Figure 13:
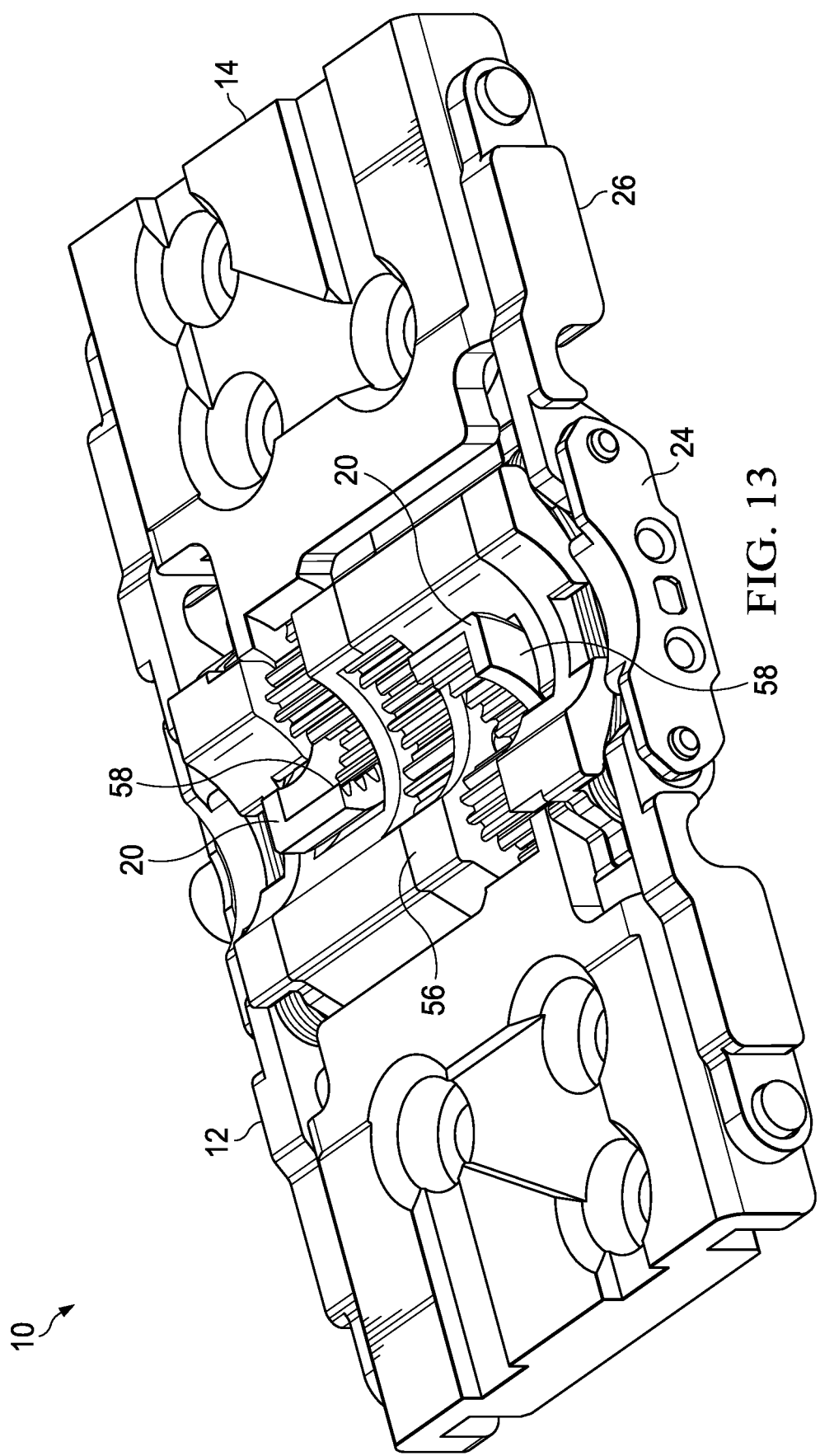
FIG. 13 depicts an upper perspective view of an alternative embodiment of a dual axis pivot hinge in an open position having bracket motion synchronized by a gear subassembly.

Referring now to FIG. 13, an upper perspective view depicts an alternative embodiment of a dual axis pivot hinge assembly 10 in an open position having bracket 14 motion synchronized by a gear subassembly 56. Hinge assembly 10 brackets 14 each have a gear member 58 that extends out in a semicircular shape with gear teeth exposed at an inner circumference and aligned to engage with gear subassembly 56. A smooth backside of each gear member 58 slides within a semicircular portion 64 to provide a pivot about the rotation axis defined by the semicircular shape. In the open position, brackets 14 support a display film disposed across hinge assembly 10 and the ends of gear members 58 project upwards from a central location of hinge assembly 10 to act as flexible display supports 20 that support the display film across the central portion of hinge assembly 10. Torque element 24 generates torque to resist bracket 14 rotation and translates the torque through torque arms 26.

Figure 14:
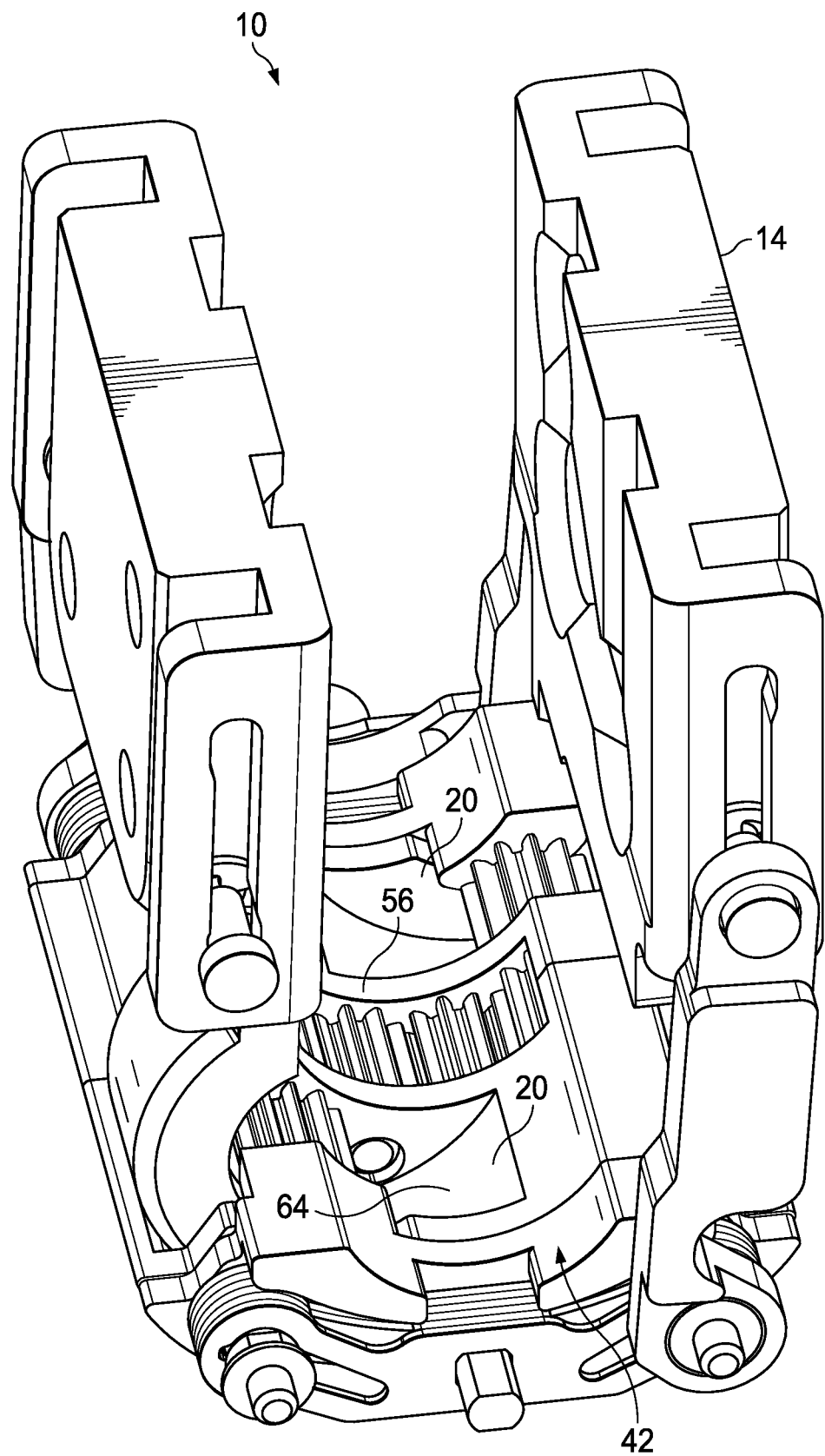
FIG. 14 depicts an upper perspective view of the dual axis pivot hinge rotated to a closed position with brackets synchronized by the gear subassembly.

Referring now to FIG. 14, an upper perspective view depicts the dual axis pivot hinge 10 rotated to a closed position with brackets 14 synchronized by gear subassembly 56. As gear members 58 slide out from semicircular portion 64, the size of fold region 42 increases by withdrawal of display film supports 20 to provide additional space for a flexible display film to fold across hinge assembly 10. The dual pivot motion defined by the separate semicircular portions 64 extends brackets 14 up and away from gear subassembly 56 to adapt to changes in the relative circumference of a display film disposed across separate housing portions that are rotationally coupled by hinge assembly 10.

Figure 15A:
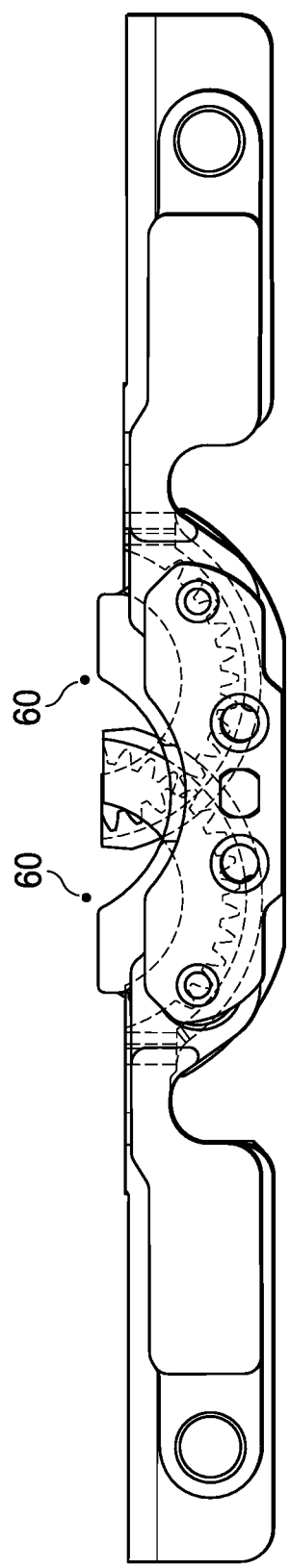
FIGS. 15A and 15B depict a side cutaway view of a comparison of bracket pivot movement with a dual axis and single axis hinge assembly.
Figure 15B:
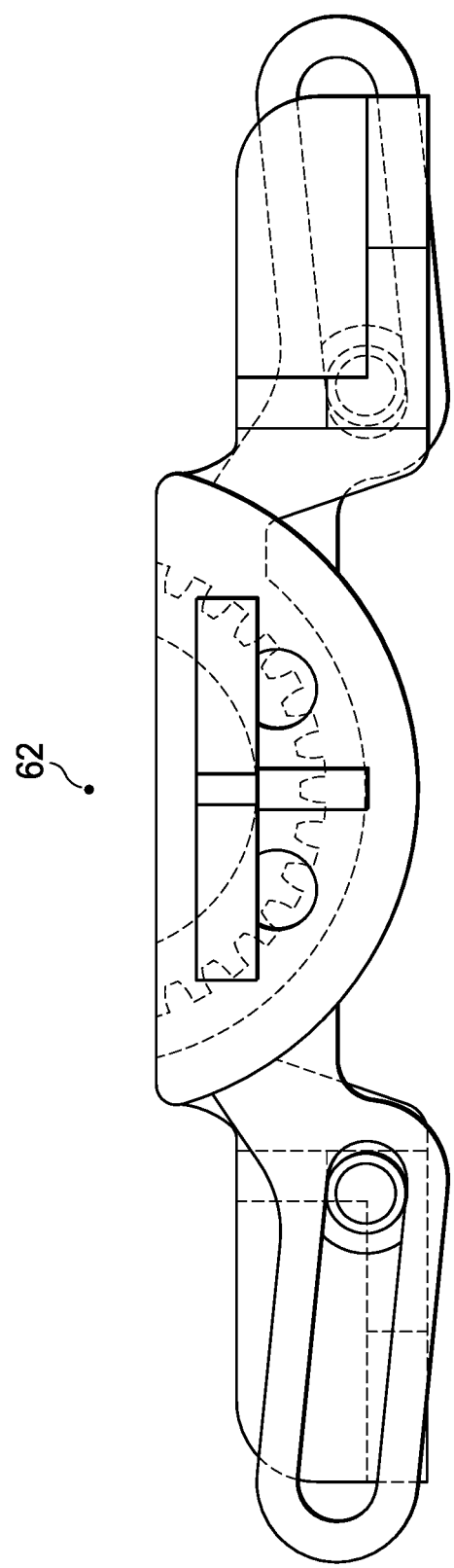

Referring now to FIGS. 15A and 15B, a side cutaway view depicts a comparison of bracket pivot movement with a dual axis and single axis hinge assembly. FIG. 15A depicts first and second axes 60, each axis defined at a center of rotation of a semicircle portion 64 in which the gear member 58 rotationally slides. The offset distance between the dual axes 60 defines an amount of room in fold region 42 in which a display film may fold. The radius of each semicircular portion 64 defines a depth into which the display film may fold. By adjusting the offset between each dual axes 60 and the radius of each semicircular portion 64 the amount of space for fold region 42 is managed based upon display film characteristics. Additional adjustments may be applied by adding some elliptical shape to the semicircular portion to further define the hinge pivot. In contrast, the single axis pivot hinge depicted by FIG. 15B has a single axis 62 about which both brackets 14 pivot. The central region under axis 62 remains static, thus limiting space within fold region 42 in which a display film may fold.

Figure 16:
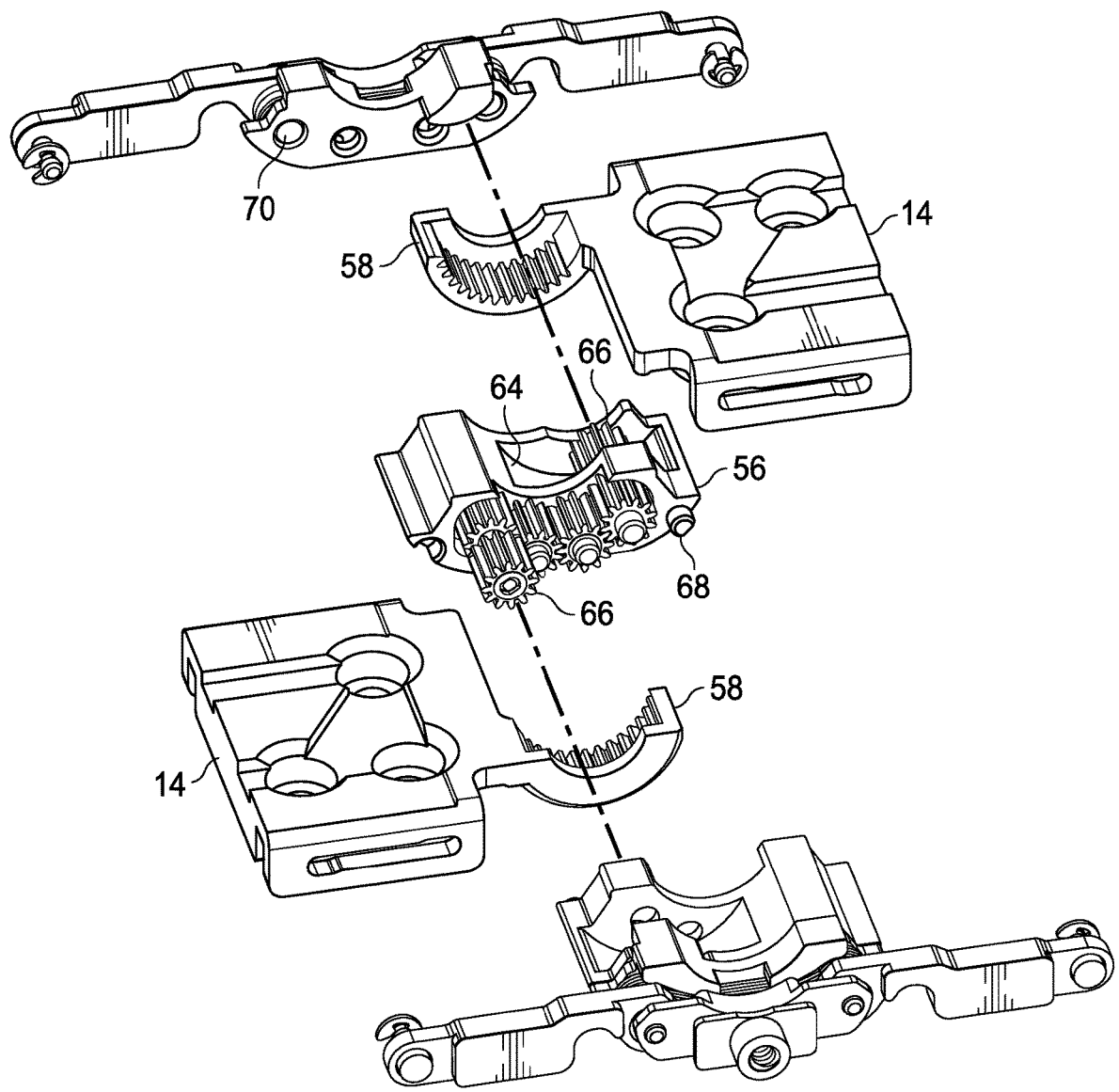
FIG. 16 depicts an exploded perspective view of a hinge assembly having a dual axis pivot synchronized by a gear subassembly.

Referring now to FIG. 16, an exploded perspective view depicts a hinge assembly 10 having a dual axis pivot synchronized by a gear subassembly 58. Each of opposing brackets 14 has a gear member 58 that extends outwards to fit in a semicircular portion 64. Each gear member 58 has a smooth side on an outer circumference surface and a gear side on the inner circumference surface. The smooth side slides within a semicircular portion 64 to rotate bracket 14 from a closed to an open position. The gear side engages with a transfer gear extending out from gear subassembly 56 to translate rotational motion of bracket 14 through gear subassembly 56 to a transfer gear 66 on an opposing side of gear subassembly 56. In turn, rotation of transfer gear 66 transfers rotational movement to the opposing bracket 14 through its gear member 58. An alignment peg 68 inserts into an alignment opening 70 to provide accurate assembly of the hinge main body. The size of gear members 58 provides some extension of the end of gear member 58 out of and above semicircle portion 64 to act as flexible display film supports 20. Torque arms 26 fit in linear slots 52 of each bracket 14 to translate torque from a torque element 24.

Figure 17:
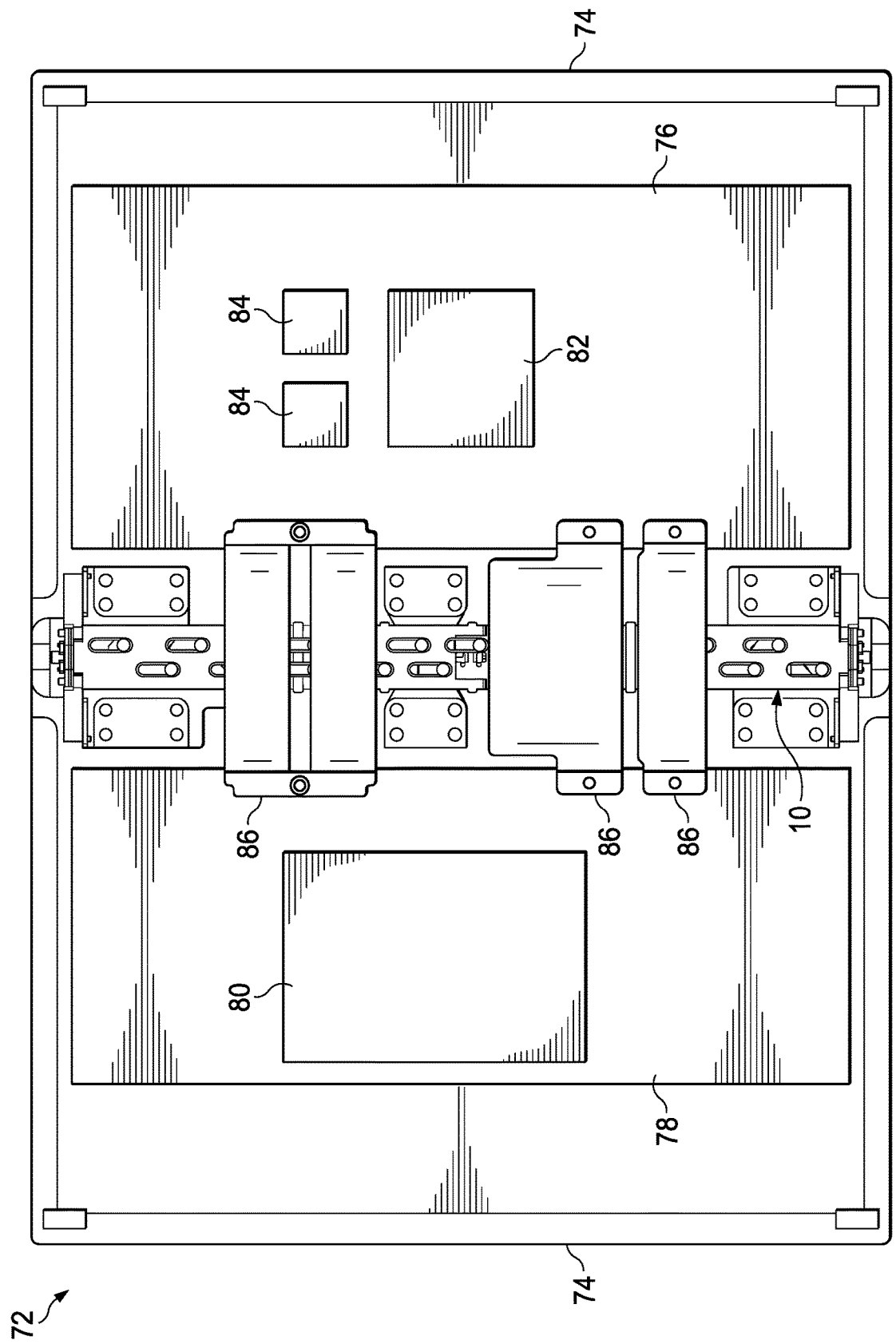
FIG. 17 depicts a top cutaway view of an information handling system having opposing housing portions rotationally coupled by a dual axes pivot hinge assembly.

Referring now to FIG. 17, a top cutaway view depicts an information handling system 72 having opposing housing portions 74 rotationally coupled by a dual axes pivot hinge assembly 10. Information handling system 72 includes a motherboard 76 in one housing portion 74 that interfaces processing components that cooperate to process information. For instance, a central processing unit (CPU) 82 executes instructions that process information and a random access memory (RAM) 84 stores the instructions and information. In the opposing housing portion 74, a daughterboard 78 supports communication with other processing components and a battery 80 that provides power to operate the processing components. In the example embodiment, power and information communicate between daughterboard 78 and motherboard 76 through flexible cable interfaces 86 that pass through hinge assembly 10. Flexible cable interface 86 houses and guides a flexible cable through hinge assembly 10 to adapt to both rotational movement of hinge assembly 10 but also translational movement as the hinge bracket extends away from the hinge main body in the closed position to provide room for folding of a flexible display film. Flexible cable interface 86 includes a series of inner and outer covers and mylar to provide a spring-type force that aids in cable translation.

Figure 18A:
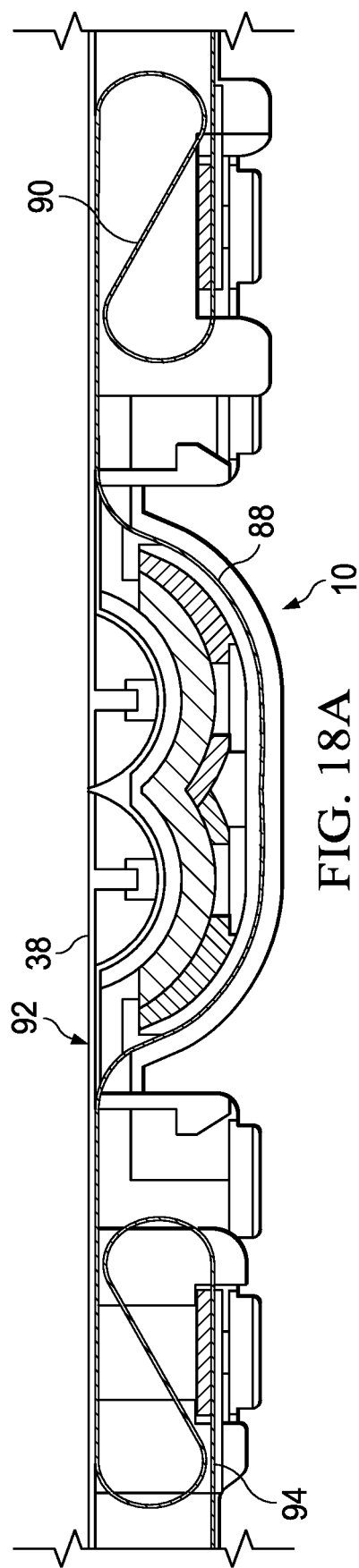
FIG. 18A, a side cutaway view depicts a flexible cable interface between housing portions and across a hinge assembly rotated to an open position.
Figure 18B:
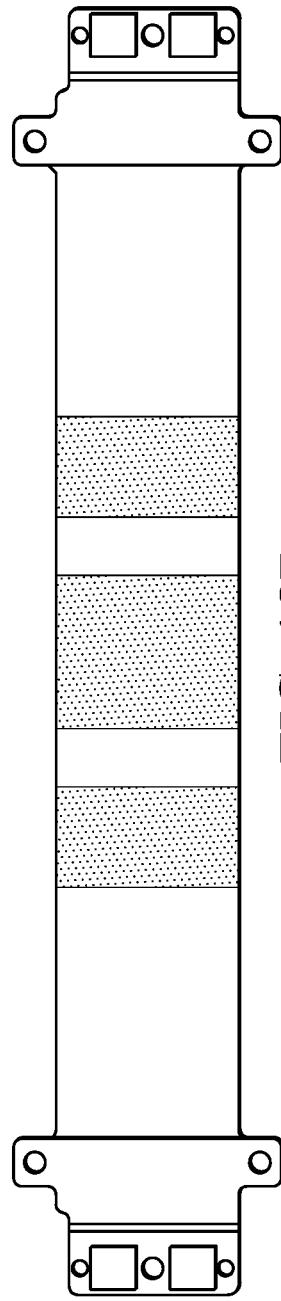
FIG. 18B depicts an example of copper distribution at a flexible cable that extends across a multi-axis pivot hinge.

Referring now to FIG. 18A, a side cutaway view depicts a flexible cable interface between housing portions 74 and across a hinge assembly 10 rotated to an open position. FIG. 18B depicts an example of copper distribution at a flexible cable that extends across a multi-axis pivot hinge. A flexible cable 88 is captured within hinge assembly 10 to prevent movement that can stress and break the cable material as hinge assembly 10 rotates. Mylar disposed about flexible cable 88 protects conductive material within flexible cable 88 by managing bend angle to at least greater than a minimum bend angle that prevents over stressing of conductive material. Flexible cable 88 follows a path that defines a motion segment 90 where stress results from bending of flexible cable 88. In the motioning segment 90, a copper removal area is defined that improves flexing of flexible cable 88 by reducing stiffness related to copper disposed within the cable, as shown in FIG. 18B. Flexible cable 88 is coupled to each housing portion 74 with a segment fixed by screw 94 or similar fixed coupling device to prevent flexing at the attachment point to the motherboard or daughterboard. Between motioning segment 90 and screw attachment point 94, flexible cable 88 is wrapped in a dual tear drop "S" pattern within each housing portion. Slack evident in flexible cable 88 in the open position as depicted by FIG. 18A adapts to translation of bracket 14 away from main body 12 as the pivot motion defined by engagement of helical members in semicircular portions of hinge assembly 10 provides extension up and away to support the smaller circumference defined for display film 38 in the closed position. The length and fold path of flexible cable 88 may vary based upon the housing size and hinge pivot motion of information handling system 72 so that the fold radius applied to flexible cable 88 does not violate minimum constraints. For instance, in a low Z-height system, the length of the S fold may be increased where less vertical height is available to maintain folding constraints. Further, mylar treatment of flexible cable 88 may be increased where sharper fold curvatures are anticipated. In addition, a roller that physically manages folding of flexible cable 88 may be included to guide the cable's fold path.

Figure 19A:
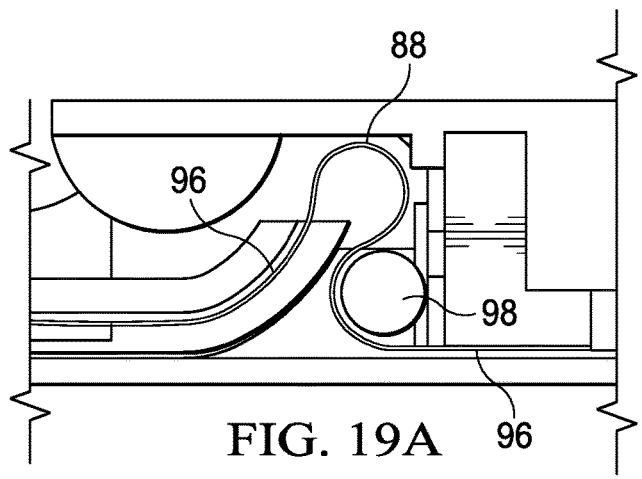
FIGS. 19A, 19B and 19C depict a side cutaway view of a flexible cable interface response to rotation of a housing portion from the open to a closed position.
Figure 19B:
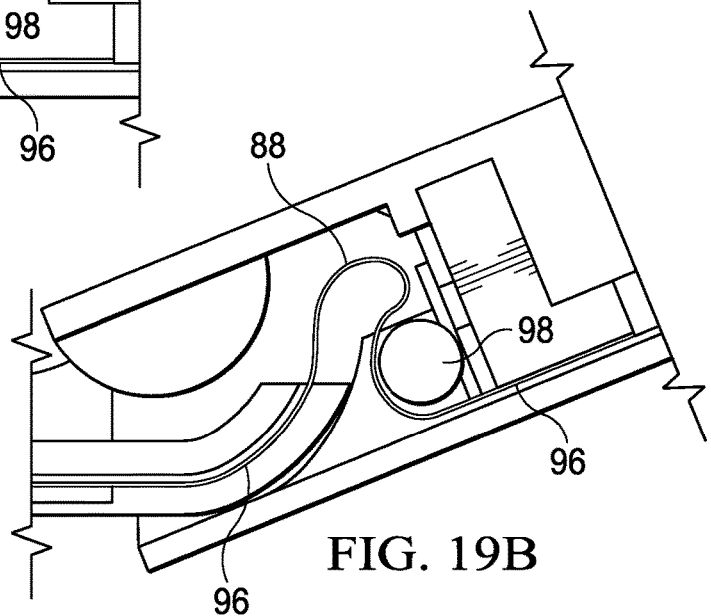
Figure 19C:
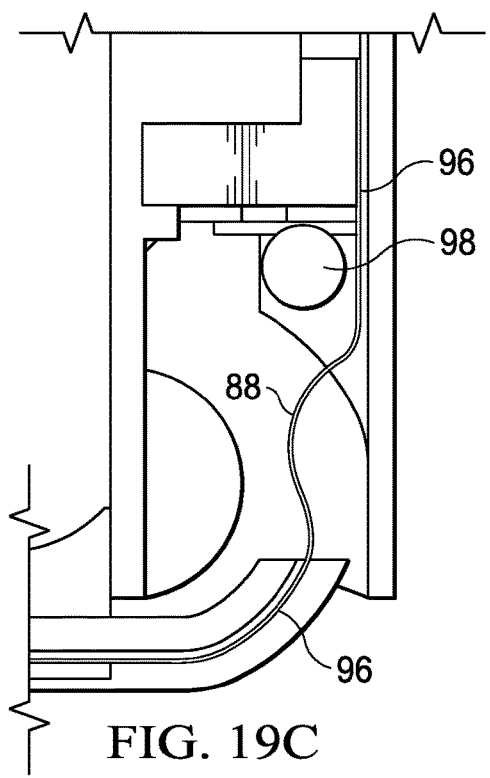

Referring now to FIGS. 19A, 19B and 19C, a side cutaway view depicts a flexible cable interface response to rotation of a housing portion from the open to a closed position. FIG. 19A depicts flexible cable 88 passing between first and second fixed locations 96 and around a roller 98 that defines a fold curvature for flexible cable 88. In the open position of FIG. 19A, flexible cable 88 forms an S shape with the lower S shape curve following the form of roller 98 to maintain at least a minimum fold radius defined by roller 98. Once rotation about hinge assembly 10 from the closed towards the open position starts, as shown by FIG. 19B, bracket 14 begins to translate upward to unfold flexible cable 88 with roller 98 helping to guide the straightening motion so that flexible cable 88 does not kink. FIG. 19C illustrates that, as hinge assembly 10 achieves the closed position, the fixed location 96 pulls flexible cable 88 straight and away from roller 98, thus avoiding tension and kinks. Once hinge assembly 10 rotates from the closed position of FIG. 19C to the open position of FIG. 19A, roller 98 again engages against flexible cable 88 to guide bending back to the S shape.

Although the present invention has been described in detail, it should be understood that various changes, substitutions and alterations can be made hereto without departing from the spirit and scope of the invention as defined by the appended claims.

What is claimed is:

1. A method for rotationally coupling first and second housing portions, the method comprising:
   coupling a first bracket to a first housing portion;
   coupling a second bracket to a second housing portion;
   inserting a first helical member extending from the first bracket into a first helical guide of a hinge main body;
   inserting a second helical member extending from the second bracket into a second helical guide of the hinge main body;
   rotating the first housing portion relative to the second housing portion; and
   translating the rotating of the first housing portion to a rotation of the second housing portion via a lateral movement of the first and second guides which is induced by a rotation of the first helical member and transferred to the second helical member through the guides:
   the method further comprising:
   coupling a torque element to an end of the main body:
   coupling a first torque arm from the torque element to a first slot of the first bracket;
   coupling a second torque arm from the torque element to a second slot of the second bracket:
   rotating the brackets relative to the torque element; and
   in response to the rotating, translating torque from the torque element to the first and second brackets through the first and second torque arms.

2. The method of claim 1 further comprising:
   varying a distance of the second housing portion to the hinge main body based upon rotational orientation of the first and second helical members in the first and second helical guides.

3. The method of claim 1 further comprising:
   extending the first and second helical members through and above the hinge main body in an open position of the first and second housing portions;
   retracting the first and second helical members within the hinge main body in a closed position of the first and second housing portions.

4. The method of claim 3 wherein guides comprise first and second rounded portions and the first and second helical members extend through and above the hinge main body between the first and second rounded portions.

5. The method of claim 4 further comprising:
   disposing a flexible display film over the first and second housing portions and hinge main body; and
   folding the flexible display film in response to rotation of the first and second housing portions from an open to a closed position.

6. The method of claim 1 further comprising:
   forming the first and second slots to have a non-linear path; and
   varying torque applied to the first and second bracket based upon the non-linear path followed through changes in rotational orientations.

* * * * *

UNITED STATES PATENT AND TRADEMARK OFFICE
CERTIFICATE OF CORRECTION

Page 1 of 1

PATENT NO. : 12,282,363 B2
APPLICATION NO. : 17/579395
DATED : April 22, 2025
INVENTOR(S) : Christopher A. Torres et al.

It is certified that error appears in the above-identified patent and that said Letters Patent is hereby corrected as shown below:

In the Claims

In Column 12, Claim 6, Line 2, please replace "first and, second" with --first and second--.

Signed and Sealed this
First Day of July, 2025

Coke Morgan Stewart
*Acting Director of the United States Patent and Trademark Office*